(12) United States Patent
Hatakeyama et al.

(10) Patent No.: US 7,510,820 B2
(45) Date of Patent: Mar. 31, 2009

(54) RESIST UNDERCOAT-FORMING MATERIAL AND PATTERNING PROCESS

(75) Inventors: Jun Hatakeyama, Joetsu (JP); Toshihiko Fujii, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/604,337

(22) Filed: Nov. 27, 2006

(65) Prior Publication Data

US 2007/0122740 A1 May 31, 2007

(30) Foreign Application Priority Data

Nov. 28, 2005 (JP) .............................. 2005-341386
Apr. 25, 2006 (JP) .............................. 2006-120120

(51) Int. Cl.
*G03F 7/40* (2006.01)
*G03F 7/11* (2006.01)

(52) U.S. Cl. ................. 430/323; 430/272.1; 430/271.1; 430/313; 526/284

(58) Field of Classification Search ....................... None
See application file for complete search history.

(56) References Cited

U.S. PATENT DOCUMENTS

| | | | |
|---|---|---|---|
| 5,972,560 A | 10/1999 | Kaneko et al. | |
| 6,042,989 A | 3/2000 | Schaedeli et al. | |
| 6,303,266 B1 * | 10/2001 | Okino et al. | 430/270.1 |
| 6,316,165 B1 | 11/2001 | Pavelchek et al. | |
| 6,420,088 B1 | 7/2002 | Angelopoulos et al. | |
| 6,506,497 B1 | 1/2003 | Kennedy et al. | |
| 6,623,909 B2 | 9/2003 | Hatakeyama et al. | |
| 6,730,453 B2 | 5/2004 | Nakashima et al. | |
| 6,852,791 B2 | 2/2005 | Kawaguchi et al. | |
| 2001/0036590 A1 * | 11/2001 | Adegawa | 430/270.1 |
| 2002/0173594 A1 * | 11/2002 | De et al. | 525/328.8 |
| 2004/0058272 A1 * | 3/2004 | Takahashi et al. | 430/270.1 |
| 2007/0111140 A1 * | 5/2007 | Hatakeyama et al. | 430/270.1 |
| 2008/0020290 A1 * | 1/2008 | Hatakeyama et al. | 430/4 |

FOREIGN PATENT DOCUMENTS

| | | |
|---|---|---|
| JP | 6-118651 A | 4/1994 |
| JP | 9-110938 A | 4/1997 |
| JP | 10-324748 A | 12/1998 |
| JP | 11-302382 A | 11/1999 |
| JP | 2000-294504 A | 10/2000 |
| JP | 2001-40293 A | 2/2001 |
| JP | 2002-14474 A | 1/2002 |
| JP | 2002-55456 A | 2/2002 |
| JP | 2002-214777 A | 7/2002 |
| JP | 2004-205658 A * | 7/2004 |

OTHER PUBLICATIONS

English translation obtained Mar. 26, 2007 from the JPO and the INPIT website of HTTP://dossier1.ipdl.ipit.go.jp. 43 pages and Machine translation of JP 2004-205658 A 1.*
W. Brunsvold et al.; "Evaluation of a Deep UV Bilayer Resist for Sub-Half Micron Lithography", SPIE vol. 1925; 1993; pp. 377, no month given.
Ranee Kwong et al.; "IBM 193nm Bilayer Resist: Materials, Lithographic Performance and Optimization"; Proceedings of SPIE vol. 4345; 2001; pp. 50, no month given.
Ulrich Schaedeli et al.; "Evaluation of Materials for 193-nm Lithography"; Journal of Photopolymer Science and Technology vol. 9, No. 3; 1996; pp. 435-446, no month given.
Tom Lynch et al.; "Properties and Performance of Near UV Reflectivity Control Layers"; SPIE vol. 2195; 1994; pp. 225-229, no month given.
J. Hatakeyama et al.; "Investigation of Discrimination Enhancement in Polysilsesquioxane Based Positive Resist for ArF Lithography"; SPIE vol. 3333; 1998; pp. 62, no month given.
J. M. Moran et al.; "High Resolution, Steep Profile Resist Patterns"; J. Vac. Sci. Technol., 16(6), Nov./Dec. 1979; pp. 1620-1624, no month given.

* cited by examiner

*Primary Examiner*—Cynthia Hamilton
(74) *Attorney, Agent, or Firm*—Westerman, Hattori, Daniels & Adrian, LLP.

(57) ABSTRACT

In the lithographic multilayer resist process, a material comprising a copolymer of a hydroxy-containing vinylnaphthalene with hydroxy-free olefins is useful in forming a resist undercoat. The undercoat-forming material has a high transparency and optimum values of n and k so that it functions as an antireflective coating during short-wavelength exposure, and has etching resistance during substrate processing by etching.

6 Claims, 6 Drawing Sheets

SUBSTRATE REFLECTANCE
INTERMEDIATE LAYER n=1.5, VARYING k

INTERMEDIATE LAYER THICKNESS (nm)

□ 0-1  ▨ 1-2  ▨ 2-3  ▨ 3-4  ■ 4-5    SUBSTRATE REFLECTANCE (%)

SUBSTRATE REFLECTANCE
INTERMEDIATE LAYER n=1.5, k=0.1
UNDERCOAT LAYER n=1.5, k=0.2

UNDERCOAT LAYER THICKNESS (nm)

□ 0-1  ▨ 1-2  ▨ 2-3  ▨ 3-4  ■ 4-5    SUBSTRATE REFLECTANCE (%)

RESIST UNDERCOAT-FORMING MATERIAL AND PATTERNING PROCESS

CROSS-REFERENCE TO RELATED APPLICATION

This non-provisional application claims priority under 35 U.S.C. §119(a) on Patent Application Nos. 2005-341386 and 2006-120120 filed in Japan on Nov. 28, 2005 and Apr. 25, 2006, respectively, the entire contents of which are hereby incorporated by reference.

TECHNICAL FIELD

This invention relates to a resist undercoat-forming material useful in forming an antireflective coating in a micropatterning process for the microfabrication of semiconductor devices or the like, and more particularly, to a resist undercoat-forming material among multilayer resist coatings in a lithographic process adapted for exposure to KrF excimer laser (248 nm), ArF excimer laser (193 nm), $F_2$ laser (157 nm), $Kr_2$ laser (146 nm), $Ar_2$ laser (126 nm), soft X-ray (EUV, 13.5 nm), electron beam (EB) or the like; and a lithographic substrate patterning process using the same.

BACKGROUND OF THE INVENTION

While a number of recent efforts are being made to achieve a finer pattern rule in the drive for higher integration and operating speeds in LSI devices, the commonly used light exposure lithography is approaching the essential limit of resolution determined by the light source wavelength.

As the light source used in the lithography for resist pattern formation, g-line (436 nm) or i-line (365 nm) from a mercury lamp has been widely used. One means believed effective for further reducing the feature size is to reduce the wavelength of exposure light. For the mass production process of 64 M-bit DRAM, the exposure light source of i-line (365 nm) was replaced by a KrF excimer laser having a shorter wavelength of 248 nm. However, for the fabrication of DRAM with a degree of integration of 1 G or more requiring a finer patterning technology (processing feature size 0.13 µm or less), a shorter wavelength light source is required. In particular, photolithography using ArF excimer laser light (193 nm) is now under investigation.

On the other hand, it is known in the art that the bilayer resist process is advantageous in forming a high-aspect ratio pattern on a stepped substrate. In order that a bilayer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF excimer laser exposure comprising a base resin in the form of polyhydroxybenzylsilsesquioxane, which is a stable alkali-soluble silicone polymer, in which some phenolic hydroxyl groups are protected with t-BOC groups, in combination with a photoacid generator (see JP-A 6-118651 and SPIE vol. 1925 (1993), p. 377). For ArF excimer laser exposure, positive resist compositions comprising as a base a silsesquioxane of the type in which cyclohexylcarboxylic acid has substituted thereon an acid labile group were proposed (see JP-A 10-324748, JP-A 11-302382, and SPIE vol. 3333 (1998), p. 62). For $F_2$ laser exposure, positive resist compositions based on a silsesquioxane having hexafluoroisopropanol as a dissolvable group were proposed (see JP-A 2002-55456). The above polymer bears in its backbone a polysilsesquioxane containing a ladder skeleton produced through polycondensation of a trialkoxysilane or trihalosilane.

Silicon-bearing (meth)acrylate polymers were proposed as a resist base polymer having silicon pendants on side chains (see JP-A 9-110938, J. Photopolymer Sci. and Technol., Vol. 9, No. 3 (1996), pp. 435-446).

The undercoat layer of the bilayer resist process is formed of a hydrocarbon compound which can be etched with oxygen gas, and must have high etching resistance since it serves as a mask when the underlying substrate is subsequently etched. For oxygen gas etching, the undercoat layer must be formed solely of a silicon atom-free hydrocarbon. To improve the line-width controllability of the upper layer of silicon-containing resist and to minimize the sidewall corrugation and pattern collapse by standing waves, the undercoat layer must also have the function of an antireflective coating. Specifically, the reflectance from the undercoat layer back into the resist film must be reduced to below 1%.

Now, the results of calculation of reflectance at film thickness varying up to the maximum of 500 nm are shown in FIGS. 1 and 2. Assume that the exposure wavelength is 193 nm, and the topcoat resist has an n value of 1.74 and a k value of 0.02. FIG. 1 shows substrate reflectance when the undercoat layer has a fixed k value of 0.3, the n value varies from 1.0 to 2.0 on the ordinate and the film thickness varies from 0 to 500 nm on the abscissa. Assuming that the undercoat layer of the bilayer resist process has a thickness of 300 nm or greater, optimum values at which the reflectance is reduced to or below 1% exist in the refractive index range of 1.6 to 1.9 which is approximate to or slightly higher than that of the topcoat resist.

FIG. 2 shows substrate reflectance when the undercoat layer has a fixed n value of 1.5 and the k value varies from 0.1 to 0.8. In the k value range of 0.24 to 0.15, the reflectance can be reduced to or below 1%. By contrast, the antireflective coating used in the form of a thin film of about 40 nm thick in the monolayer resist process has an optimum k value in the range of 0.4 to 0.5, which differs from the optimum k value of the undercoat layer used with a thickness of 300 nm or greater in the bilayer resist process. For the undercoat layer in the bilayer resist process, an undercoat layer having a lower k value, that is, more transparent is necessary.

As the material for forming an undercoat layer in 193 nm lithography, copolymers of polyhydroxystyrene with acrylates are under study as described in SPIE vol. 4345, p. 50 (2001). Polyhydroxystyrene has a very strong absorption at 193 nm and its k value is as high as around 0.6 by itself. By copolymerizing with an acrylic ester having a k value of almost 0, the k value of the copolymer is adjusted to around 0.25.

However, the resistance of the acrylic polymer to substrate etching is weak as compared with polyhydroxystyrene, and a considerable proportion of the acrylic ester must be copolymerized in order to reduce the k value. As a result, the resistance to substrate etching is considerably reduced. The etching resistance is not only reflected by the etching speed, but also evidenced by the development of surface roughness after etching. Through copolymerization of acrylic ester, the surface roughness after etching is increased to a level of serious concern.

Naphthalene ring is one of rings that have a more transparency at 193 nm and a higher etching resistance than benzene ring. JP-A 2002-14474 proposes an undercoat layer having a naphthalene or anthracene ring. However, since naphthol-copolycondensed novolac resin and polyvinyl naphthalene resin have k values in the range of 0.3 to 0.4, the target transparency corresponding to a k value of 0.1 to 0.3 is not reached, with a further improvement in transparency being necessary. The naphthol-copolycondensed novolac resin and polyvinyl naphthalene resin have low n values at 193 nm, as evidenced by a value of 1.4 for the naphthol-copolycondensed novolac resin and a value of only 1.2 for the polyvinyl naphthalene resin when the inventors measured. JP-A 2001-40293 and JP-A 2002-214777 describe acenaphthylene polymers which have lower n values and higher k values at the wavelength of 193 nm than at 248 nm, both falling outside the target values. There is a need for an undercoat layer having a high n value, a low k value, transparency and high etching resistance.

Also proposed was a tri-layer process of stacking a silicon-free monolayer resist as a topcoat, an intermediate layer containing silicon below the resist, and an organic undercoat below the intermediate layer. See J. Vac. Sci. Technol., 16(6), November/December 1979. Since the monolayer resist generally provides better resolution than the silicon-bearing resist, the tri-layer process permits such a high resolution monolayer resist to be used as an imaging layer for light exposure. A spin-on-glass (SOG) coating is used as the intermediate layer. A number of SOG coatings have been proposed.

In the tri-layer process, the optimum optical constants of the undercoat layer for controlling reflection from the substrate are different from those in the bilayer process. The purpose of minimizing substrate reflection, specifically to a level of 1% or less is the same between the bi- and tri-layer processes. In the bilayer process, only the undercoat layer is endowed with the antireflective effect. In the tri-layer process, either one or both of the intermediate layer and the undercoat layer may be endowed with the antireflective effect.

U.S. Pat. No. 6,506,497 and U.S. Pat. No. 6,420,088 disclose silicon-bearing layer materials endowed with antireflective effect. In general, a multi-layer antireflective coating has greater antireflective effect than a monolayer antireflective coating and commercially widely used as an antireflective film for optical articles. A higher antireflective effect is obtainable by imparting an antireflective effect to both an intermediate layer and an undercoat layer. If the silicon-bearing intermediate layer in the tri-layer process is endowed with the function of an antireflective coating, the undercoat layer need not necessarily possess the maximum function of an antireflective coating. In the tri-layer process, the undercoat layer is required to have high etching resistance during substrate processing rather than the antireflective coating function. Then a novolac resin having high etching resistance and containing more aromatic groups must be used as the undercoat layer in the tri-layer process.

FIG. 3 illustrates substrate reflectance with a change of the k value of the intermediate layer. It is seen that by setting a k value as low as 0.2 or less and an appropriate thickness to the intermediate layer, a satisfactory antireflective effect as demonstrated by a substrate reflectance of up to 1% is achievable. In general, the antireflective coating must have a k value of 0.2 or greater in order to reduce reflectance to or below 1% at a coating thickness of 100 nm or less (see FIG. 2). In the tri-layer structure wherein the undercoat layer serves to restrain reflection to a certain extent, the intermediate layer may have an optimum k value of less than 0.2.

FIGS. 4 and 5 illustrate changes of reflectance with the varying thickness of the intermediate layer and undercoat layer, when the undercoat layer has a k value of 0.2 and 0.6, respectively. The undercoat layer having a k value of 0.2 assumedly corresponds to the undercoat layer optimized for the bilayer process, and the k value of 0.6 for the undercoat layer is approximate to the k values at 193 nm of novolac and polyhydroxystyrene. The thickness of the undercoat layer varies with the topography of the substrate whereas the thickness of the intermediate layer is kept substantially unchanged so that presumably it can be coated to the predetermined thickness. The undercoat layer with a higher k value (0.6) is effective in reducing reflectance to 1% or less with a thinner film. In the event where the undercoat layer has a k value of 0.2 and a thickness of 250 nm, the intermediate layer must be increased in thickness in order to provide a reflectance of 1% or less. Increasing the thickness of the intermediate layer is not preferable because a greater load is applied to the topcoat of resist during dry etching of the intermediate layer. To use the undercoat layer in thin film form, it must have not only a high k value, but also greater etching resistance.

SUMMARY OF THE INVENTION

An object of the present invention is to provide a resist undercoat-forming material which is useful as an undercoat layer in the multilayer resist technology, typically the bilayer resist technology, using a silicon-containing resist topcoat film, functions as an antireflective coating during short-wavelength exposure, has higher transparency than polyhydroxystyrene, cresol novolac resins, and naphthol novolac resins, optimum n and k values, and improved etching resistance during substrate processing; and a lithographic process for patterning a substrate using the same.

In one aspect, the invention provides a resist undercoat-forming material for forming a resist undercoat among lithographic multilayer resist coatings, comprising at least a copolymer of a hydroxy-containing vinyl naphthalene and one or more hydroxy-free olefins.

The hydroxy-free olefin is preferably selected from the group consisting of indenes, acenaphthylenes, nortricyclenes, vinyl ethers of 7 to 30 carbon atoms, (meth)acrylates, vinyl carboxylates, (meth)acrylamides, and vinyl-containing condensed hydrocarbons of 13 to 30 carbon atoms.

In a preferred embodiment, the copolymer comprises recurring units having the general formula (1):

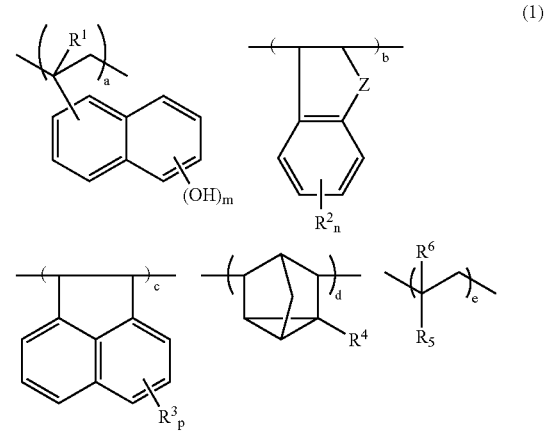

wherein $R^1$ and $R^6$ each are hydrogen or methyl; $R^2$, $R^3$ and $R^4$ each are a hydrogen atom, $C_1$-$C_4$ alkyl group, alkoxy group, hydroxy group, acetoxy group or alkoxycarbonyl group, or $C_6$-$C_{10}$ aryl group; $R^5$ is a $C_{13}$-$C_{30}$ condensed polycyclic hydrocarbon group, —O—$R^7$, —C(=O)—O—$R^7$, —O—C(=O)—$R^7$, or —C(=O)—$NR^8$—$R^7$, wherein $R^7$ is a $C_7$-$C_{30}$ organic group, and $R^8$ is a hydrogen atom or $C_1$-$C_6$ hydrocarbon group; m is 1 or 2, n is an integer of 0 to 4, p is an integer of 0 to 6, a, b, c, d, and e are numbers in the range: $0<a<1.0$, $0\leq b\leq 0.8$, $0\leq c\leq 0.8$, $0\leq d\leq 0.8$, $0\leq e\leq 0.8$, and $0<b+c+d+e<1.0$.

The resist undercoat-forming material comprising a polymer prepared through copolymerization of recurring units derived from hydroxy-containing vinyl naphthalene, especially recurring units of formula (1), as defined above, functions as an antireflective coating during short-wavelength exposure and has high transparency, optimum n and k values, and additionally, improved etching resistance during substrate processing.

The resist undercoat-forming material may further comprise at least one component selected from an organic solvent, acid generator, and crosslinker. The inclusion of an organic solvent, acid generator, and/or crosslinker in the resist undercoat-forming material is effective for improving the coating performance of the material to a substrate or the like, or promoting crosslinking reaction within the undercoat during baking after coating onto a substrate or the like. Then the resist undercoat has improved coating thickness uniformity, minimizes the risk of intermixing with the resist topcoat, and minimizes diffusion of low-molecular-weight fractions into the resist topcoat.

When a pattern is formed on a substrate by lithography using the resist undercoat-forming material of the invention, the substrate can be patterned at a high precision.

In another aspect, the invention provides a patterning process comprising the steps of applying the resist undercoat-forming material defined above onto a processable substrate to form an undercoat layer, applying a photoresist composition onto the undercoat layer to form a photoresist layer, exposing the photoresist layer in a predetermined region to radiation, developing the photoresist layer with a developer to form a photoresist pattern, and processing the undercoat layer and the substrate through the patterned photoresist layer as a mask, by means of a dry etching apparatus.

The resist undercoat layer formed from the resist undercoat-forming material of the invention performs well particularly when the resist topcoat composition comprises a silicon atom-bearing polymer, and the processing step includes dry etching the undercoat layer through the resist topcoat layer as a mask with an oxygen or hydrogen-based etching gas. Then, by etching the substrate with such multilayer resist coating serving as a mask, the substrate can be patterned at a high precision.

In a further aspect, the invention provides a patterning process comprising the steps of applying the resist undercoat-forming material defined above onto a processable substrate to form a resist undercoat layer, applying a silicon atom-containing intermediate layer over the undercoat layer, applying a photoresist composition onto the intermediate layer to form a photoresist layer, exposing the photoresist layer in a predetermined region to radiation, developing the photoresist layer with a developer to form a photoresist pattern, processing the intermediate layer through the patterned photoresist layer as a mask, removing the patterned photoresist layer, and processing the undercoat layer and then the substrate through the processed intermediate layer as a mask, the processing steps using a dry etching apparatus.

In a preferred embodiment, the photoresist composition comprises a silicon atom-free polymer, and the step of processing the undercoat layer includes dry etching with an oxygen or hydrogen-based etching gas.

BENEFITS OF THE INVENTION

The resist undercoat-forming material of the present invention is useful as a resist undercoat layer in the multilayer resist technology, typically the bilayer resist technology, using a silicon-containing resist topcoat film. It functions as an antireflective coating during short-wavelength exposure, has higher transparency than polyhydroxystyrene, cresol novolac resins, and naphthol novolac resins, optimum values of n (refractive index) and k (extinction coefficient), and additionally, improved etching resistance during substrate processing.

DESCRIPTION OF THE PREFERRED EMBODIMENTS

Figure 1:
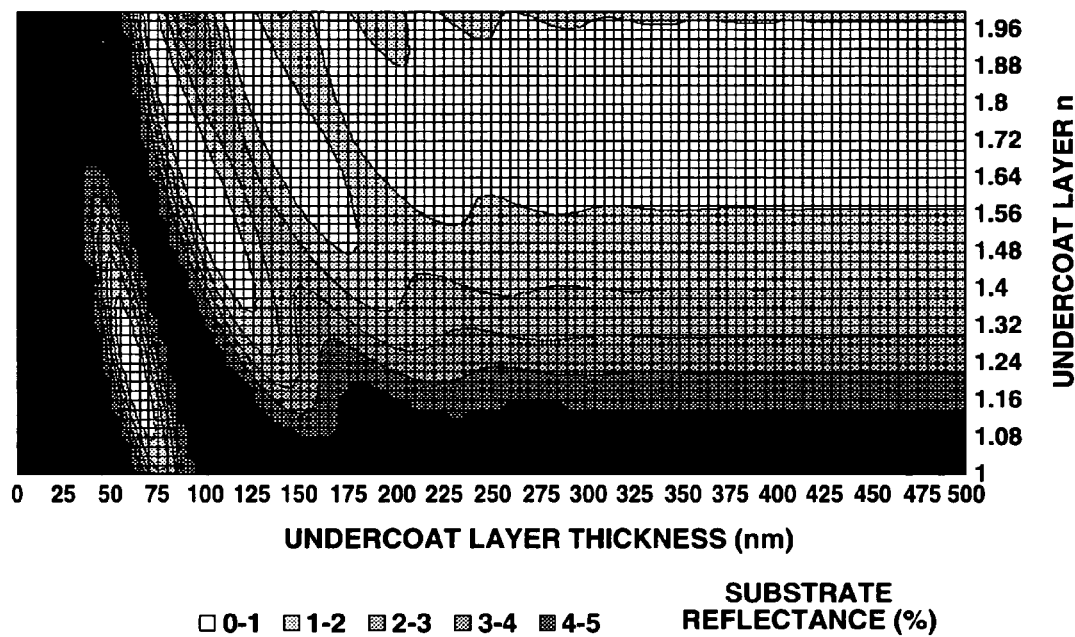
FIG. 1 is a graph plotting the substrate reflectance versus undercoat layer thickness in bilayer process when the k value of the undercoat layer is fixed at 0.3 and the n value varies from 1.0 to 2.0.
Figure 2:
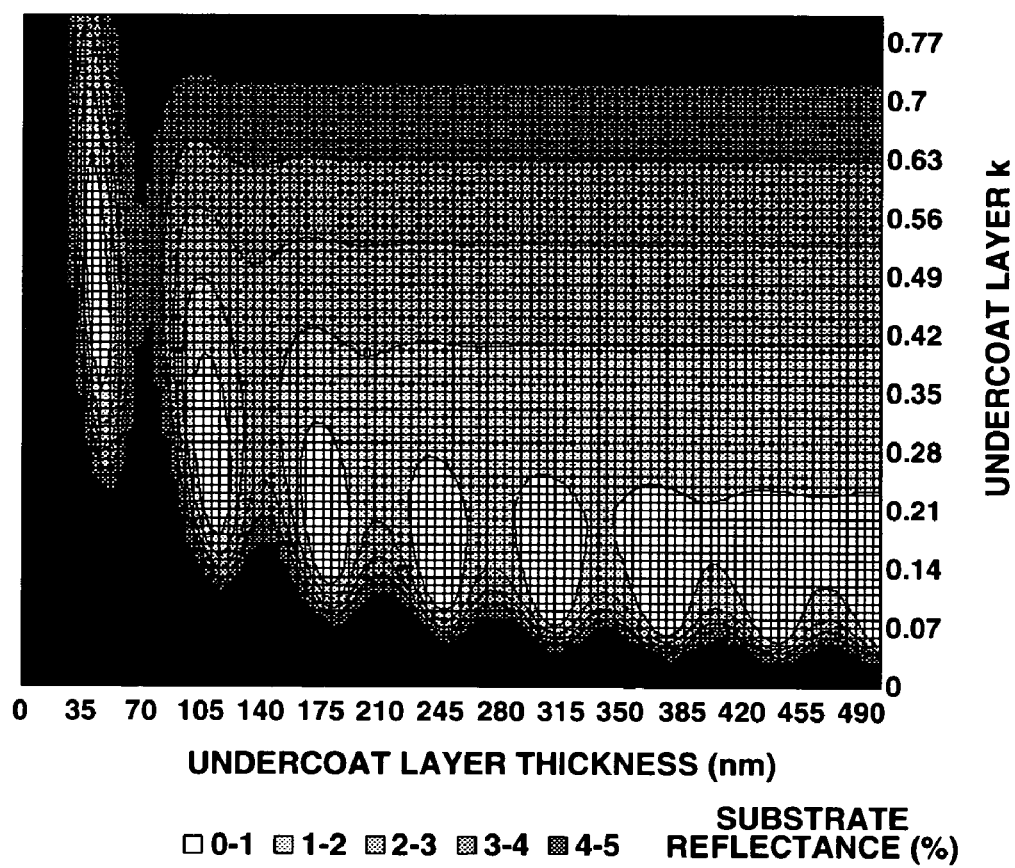
FIG. 2 is a graph plotting the substrate reflectance versus undercoat layer thickness in bilayer process when the n value of the undercoat layer is fixed at 1.5 and the k value varies from 0.1 to 1.0.
Figure 3:
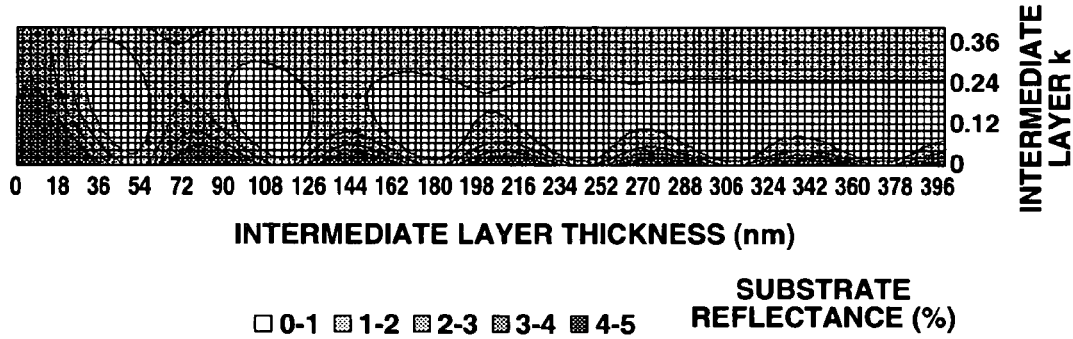
FIG. 3 is a graph plotting the substrate reflectance in trilayer process when the undercoat layer has a fixed n of 1.5, a fixed k of 0.6 and a fixed thickness of 500 nm, and the intermediate layer has a fixed n of 1.5, a k value varying from 0 to 0.3 and a thickness varying from 0 to 400 nm.
Figure 4:
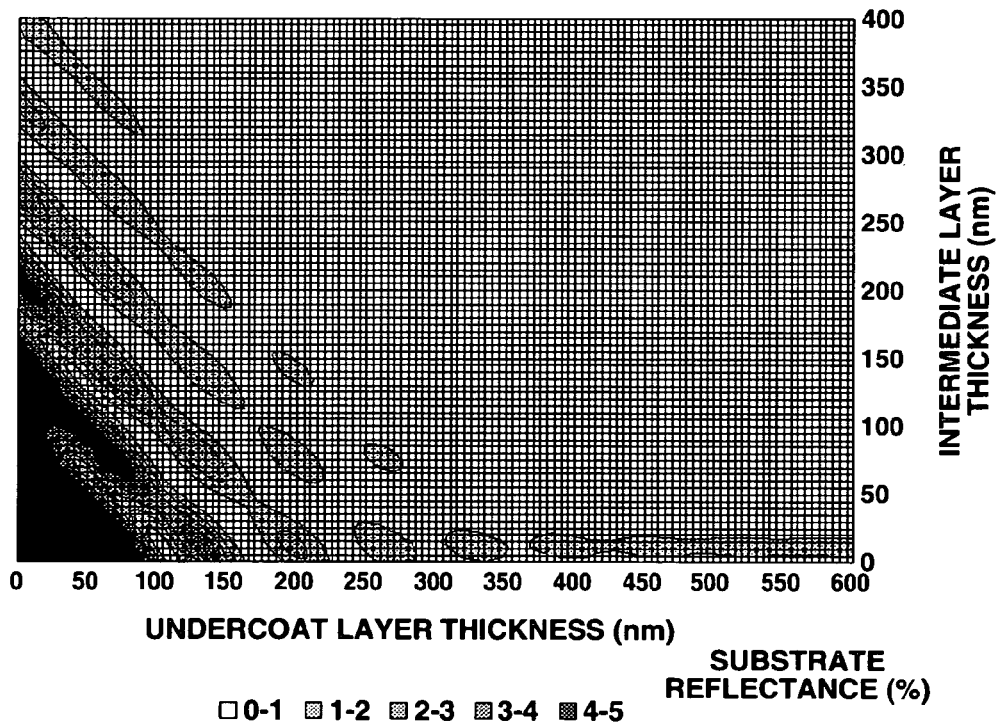
FIG. 4 is a graph plotting the substrate reflectance versus varying thickness of the undercoat layer and intermediate layer in trilayer process when the undercoat layer has a fixed n of 1.5 and a fixed k of 0.2, and the intermediate layer has a fixed n of 1.5 and a fixed k of 0.1.
Figure 5:
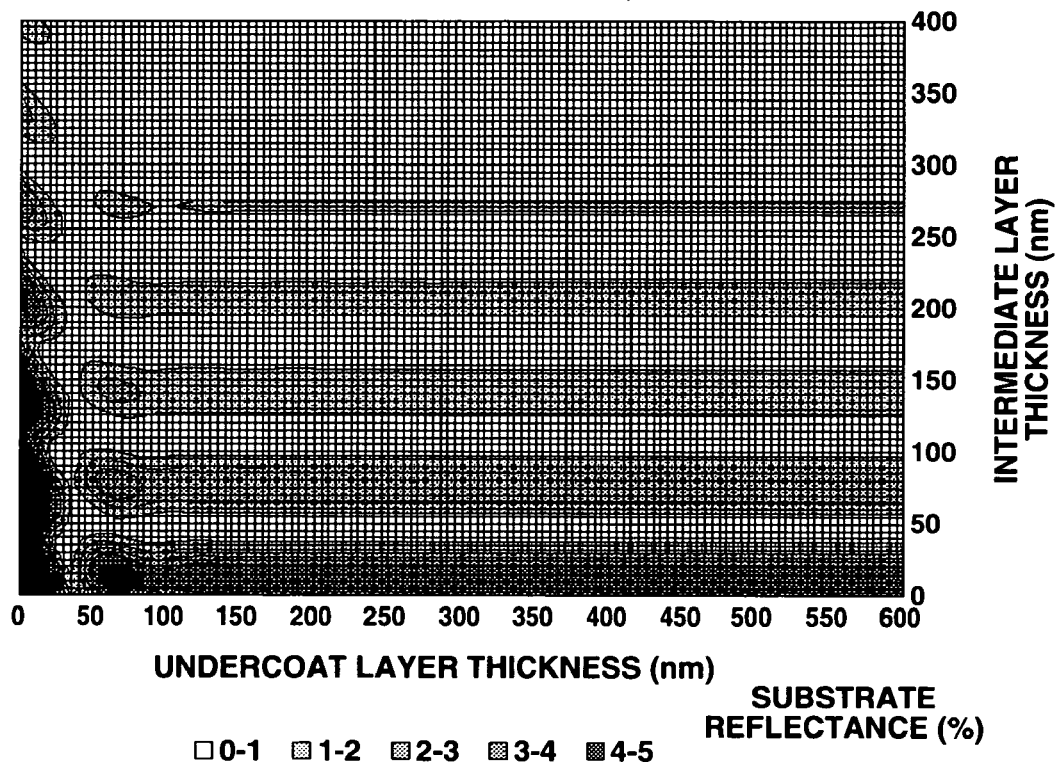
FIG. 5 is a graph plotting the substrate reflectance versus varying thickness of the undercoat layer and intermediate layer in trilayer process when the undercoat layer has a fixed n of 1.5 and a fixed k of 0.6, and the intermediate layer has a fixed n of 1.5 and a fixed k of 0.1.

The singular forms "a", "an" and "the" include plural referents unless the context clearly dictates otherwise. The notation (Cn-Cm) means a group containing from n to m carbon atoms per group.

The inventors have discovered that a polymer prepared through copolymerization of recurring units derived from hydroxy-containing vinyl naphthalene has optimum values of n and k during exposure to radiation with a short wavelength, typically 193 nm and exhibits good etching resistance, and is thus a promising material to form a resist undercoat layer in the multilayer resist process such as the bilayer resist process using a silicon-containing layer or the trilayer resist process using a silicon-containing intermediate layer.

From the resist undercoat-forming material of the invention, a novel resist undercoat layer can be formed which is applicable to the multilayer resist process such as the bilayer resist process using a silicon-containing layer or the trilayer resist process using a silicon-containing intermediate layer. At a thickness of at least 150 nm, especially 200 to 600 nm, this undercoat layer exerts an excellent antireflective effect to exposure at a short wavelength, typically 193 nm and excellent etching resistance under substrate etching conditions.

The inclusion of an organic solvent, acid generator, and/or crosslinker in the resist undercoat-forming material is able to improve the coating performance of the material to a substrate or the like, or promote crosslinking reaction within the undercoat during baking after coating onto a substrate or the like. Then the resist undercoat has improved coating thickness uniformity, minimizes the risk of intermixing with the resist topcoat, and minimizes diffusion of low-molecular-weight fractions into the resist topcoat.

The resist undercoat-forming material of the invention is suitable for forming a resist undercoat among lithographic multilayer resist coatings and defined as comprising at least a copolymer of a hydroxy-containing vinyl naphthalene and one or more hydroxy-free olefins. The hydroxy-free olefin is typically selected from among indenes, acenaphthylenes, nortricyclenes, vinyl ethers of 7 to 30 carbon atoms, (meth) acrylates, vinyl carboxylates, (meth)acrylamides, and vinyl-containing condensed hydrocarbons of 13 to 30 carbon atoms.

In a preferred embodiment, the copolymer comprises recurring units having the general formula (1).

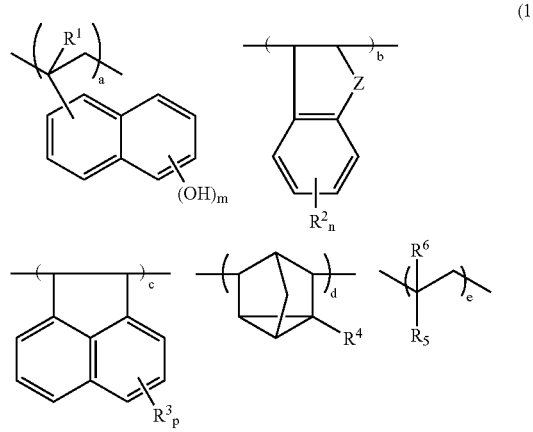

(1)

Herein $R^1$ and $R^6$ each are hydrogen or methyl. $R^2$, $R^3$ and $R^4$ each are a hydrogen atom, $C_1$-$C_4$ alkyl group, alkoxy group, hydroxy group, acetoxy group or alkoxycarbonyl group, or $C_6$-$C_{10}$ aryl group. $R^5$ is a $C_{13}$-$C_{30}$ condensed polycyclic hydrocarbon group, —O—$R^7$, —C(=O)—O—$R^7$, —O—C(=O)—$R^7$, or —C(=O)—$NR^8$—$R^7$, wherein $R^7$ is a $C_7$-$C_{30}$ organic group, and $R^8$ is a hydrogen atom or $C_1$-$C_6$ hydrocarbon group. The subscript m is 1 or 2, n is an integer of 0 to 4, p is an integer of 0 to 6, a, b, c, d, and e are numbers in the range: 0<a<1.0, 0≦b≦0.8, 0≦c≦0.8, 0≦d≦0.8, 0≦e≦0.8, and 0<b+c+d+e <1.0.

Suitable $C_{13}$-$C_{30}$ condensed polycyclic hydrocarbon groups represented by $R^5$ include anthracene, pyrene, fluorene, phenanthrene, chrysene, naphthacene, and pentacene groups.

Of the recurring units in the copolymer included in the resist undercoat-forming material of the invention, those recurring units "a" derived from hydroxy-containing vinyl-naphthalene are as exemplified below.

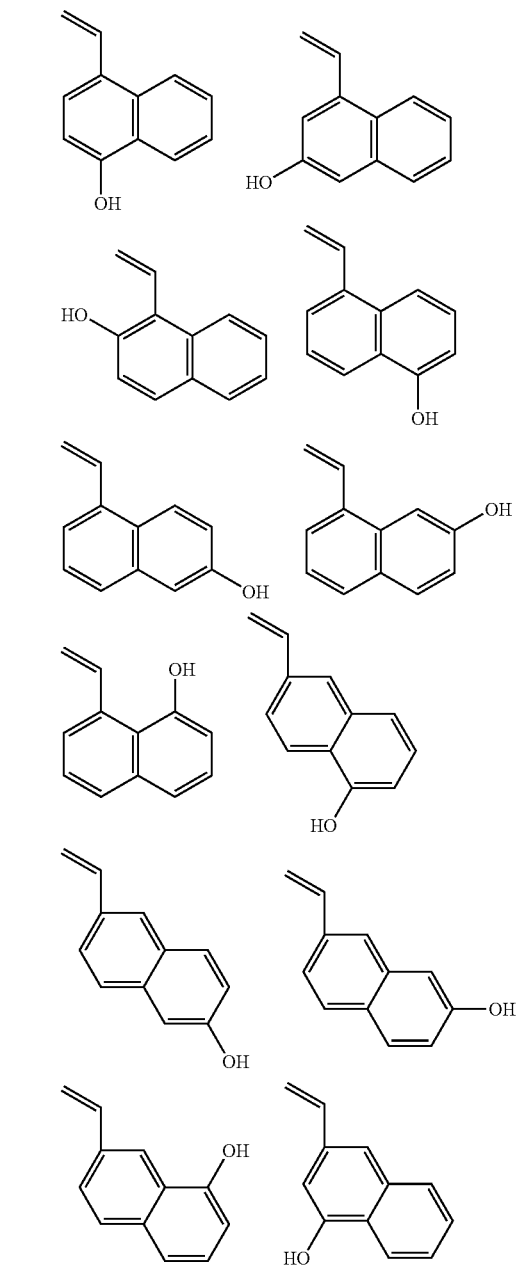

In formula (1), the recurring units "b" are derived from indenes, benzofurans, or benzothiophenes; the recurring units "c" are derived from acenaphthylenes; the recurring units "d" are derived from nortricyclenes; and the recurring units "e" are derived from vinyl-containing condensed hydrocarbons of 13 to 30 carbon atoms. Examples of vinyl-containing condensed hydrocarbons of 13 to 30 carbon atoms include vinylanthracene, vinylpyrene, vinylfluorene, vinylphenanthrene, vinylchrysene, vinylnaphthacene, vinylpentacene, and vinylacenaphthene.

Where $R^5$ in formula (1) is —O—$R^7$, the corresponding recurring units are derived through copolymerization of vinyl ethers having $R^7$ wherein $R^7$ is a $C_7$-$C_{30}$ organic group. It is noted that $R^7$ may contain

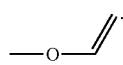
Where R[7] contains
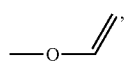
the vinyl ethers are vinyl ethers having two vinyl groups, i.e., divinyl ethers, wherein each of the vinyl groups copolymerizes with a vinyl group of another monomer to form a crosslink. Examples of the vinyl ethers wherein RS is —O—R[7] are given below.
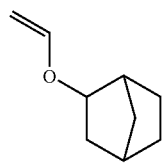 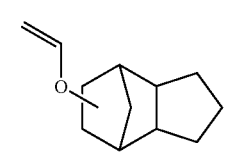
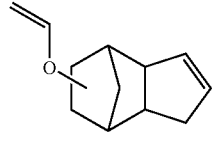 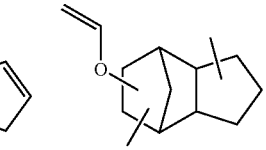
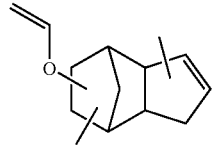 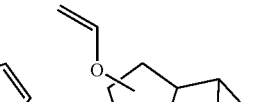
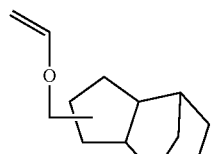 
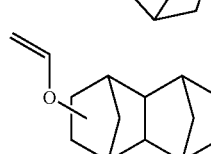 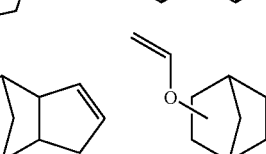
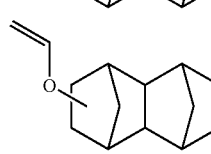 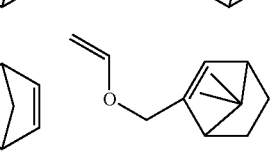
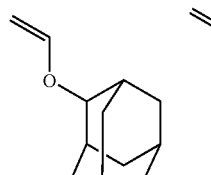 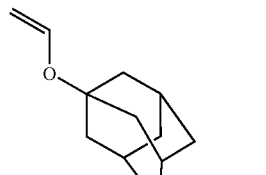
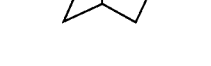 
 
-continued
 
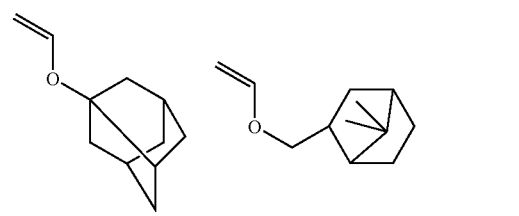 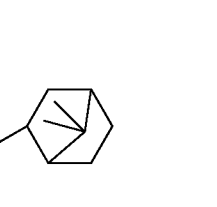
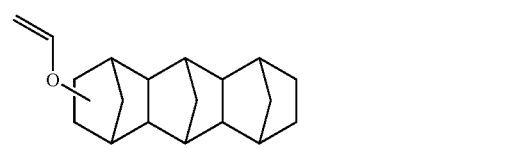 
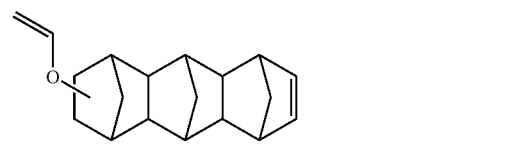 
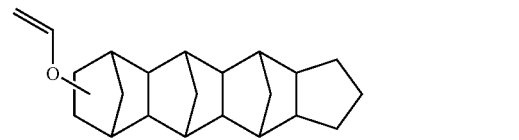 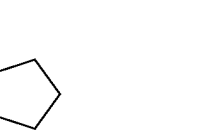
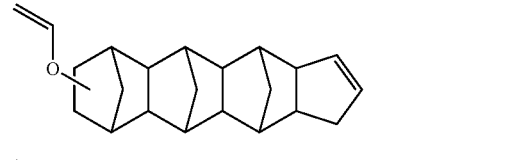 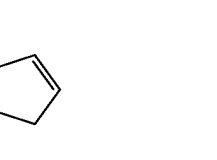
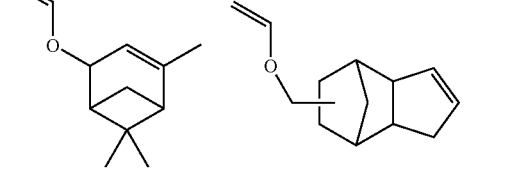 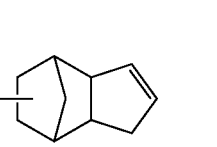
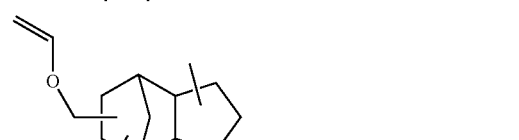 
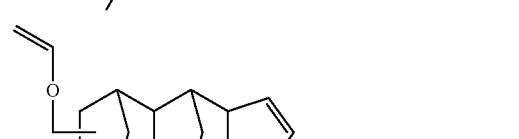 
 

-continued

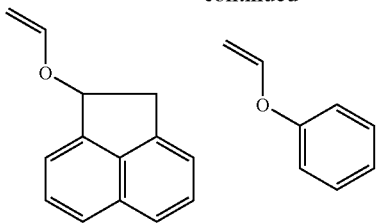
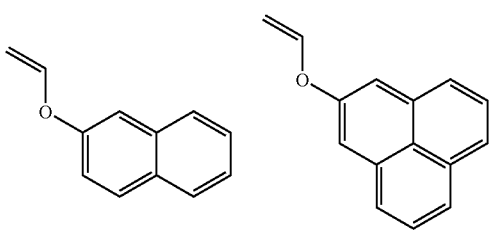
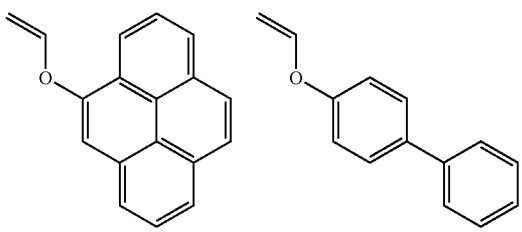
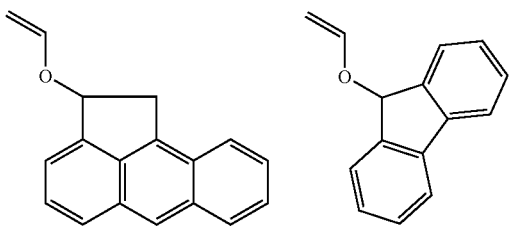
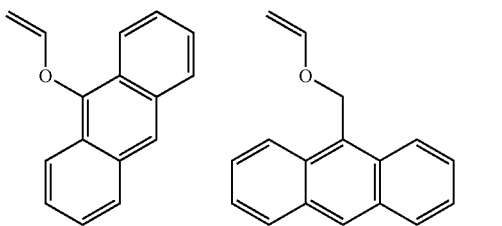
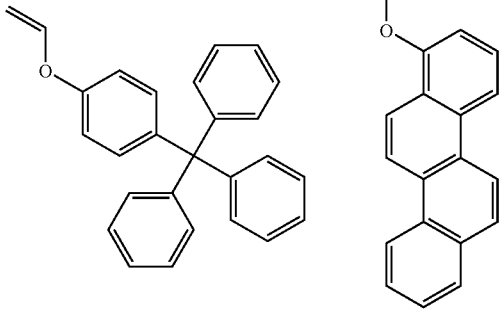

-continued

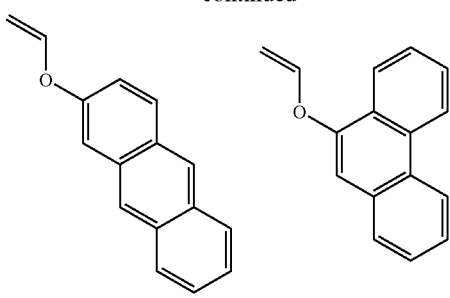
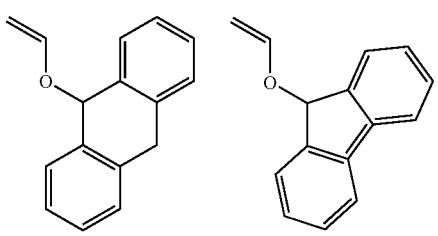
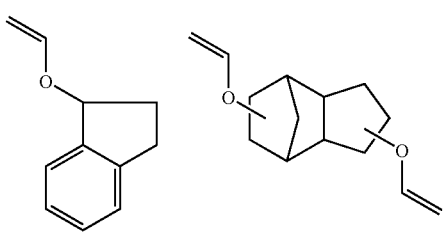

Where $R^5$ in formula (1) is —C(=O)—O—$R^7$, the corresponding recurring units are derived through copolymerization of (meth)acrylates having $R^7$ wherein $R^7$ is a $C_7$-$C_{30}$ organic group. Examples of suitable (meth)acrylates are illustrated below. It is noted that where $R^5$ is —C(=O)—NR$^8$—$R^7$, exemplary compounds are given by replacing the —C(=O)—O— moiety of the compounds illustrated below by —C(=O)—NR$^8$— wherein $R^8$ is a hydrogen atom or a $C_1$-$C_6$ monovalent hydrocarbon group such as an alkyl or phenyl group. In the following formulae, $R^6$ is a hydrogen atom or methyl group.

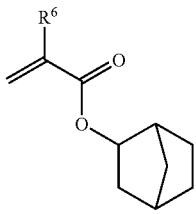
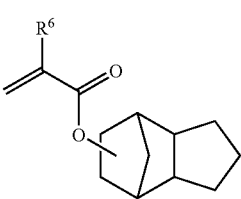
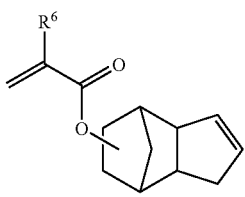

-continued
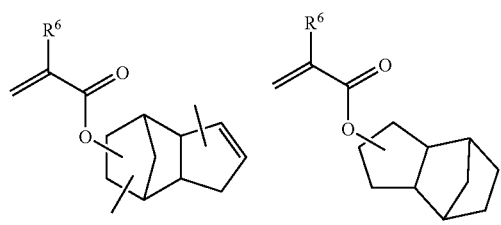
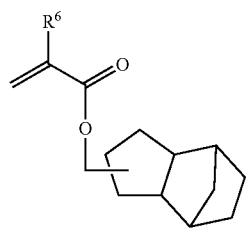
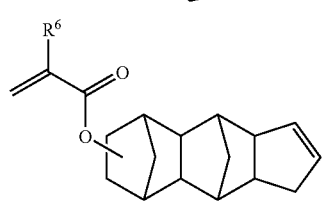
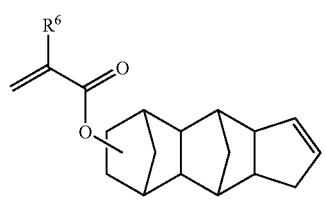
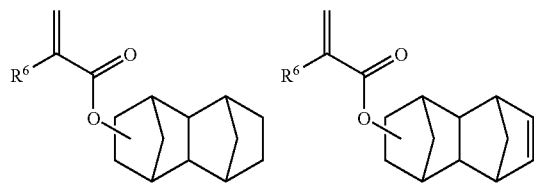
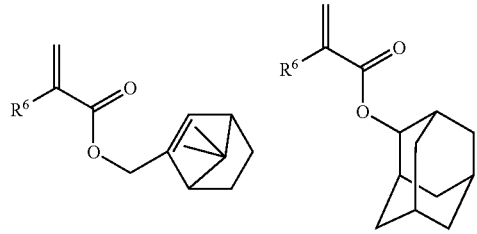
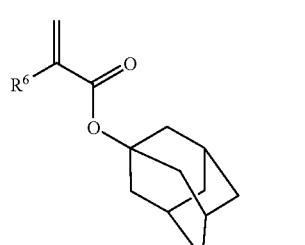
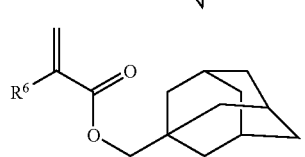
-continued
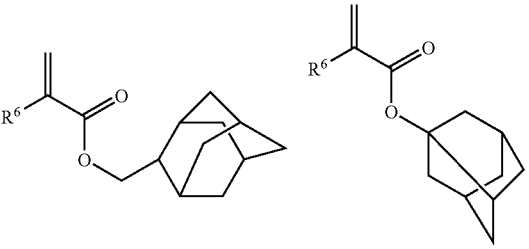
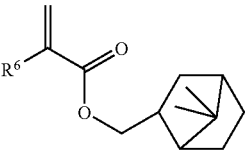
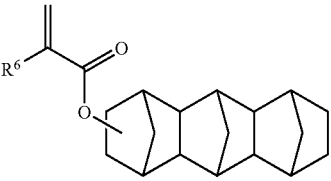
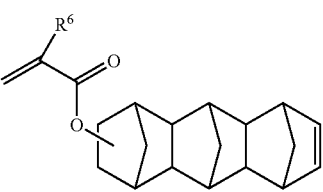
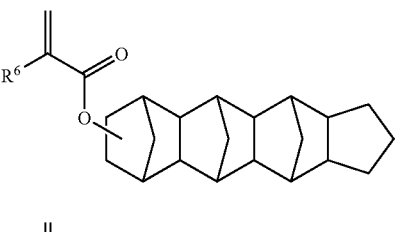
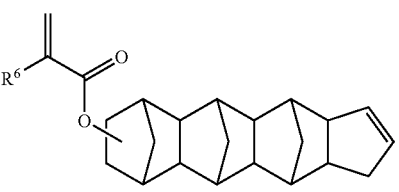
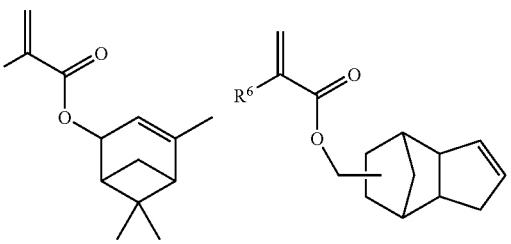
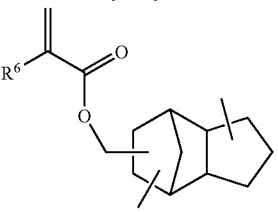

-continued
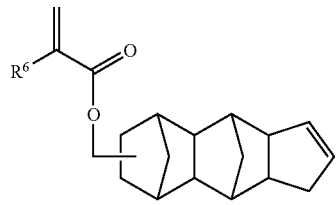
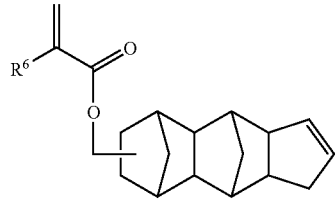
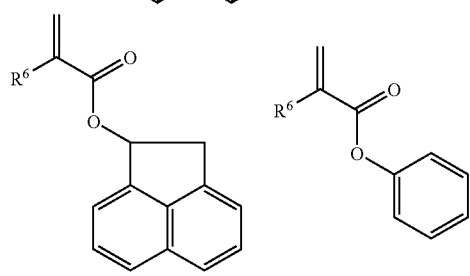
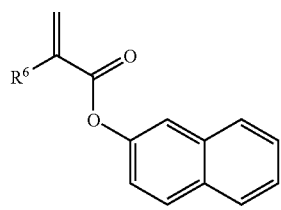
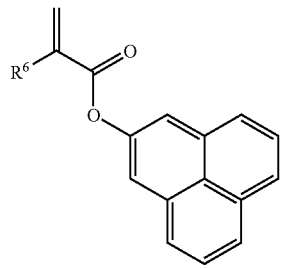
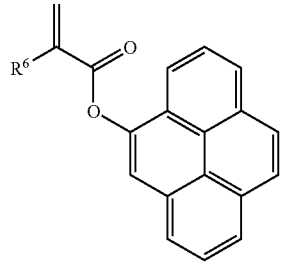
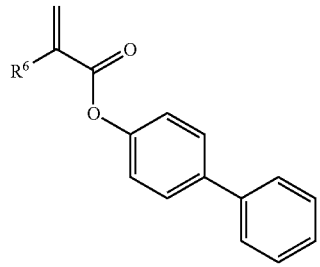
-continued
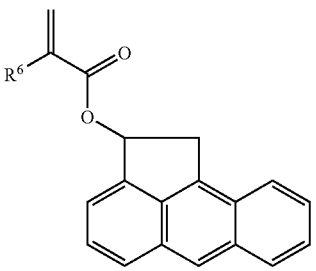
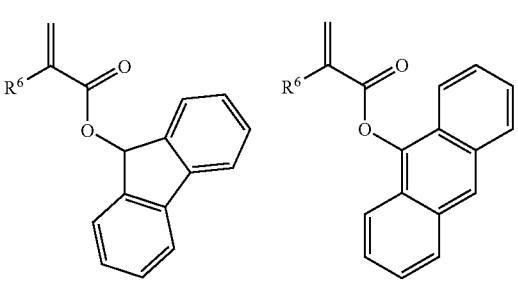
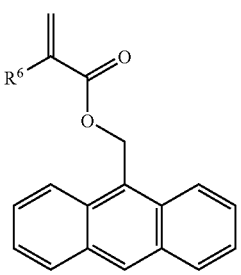
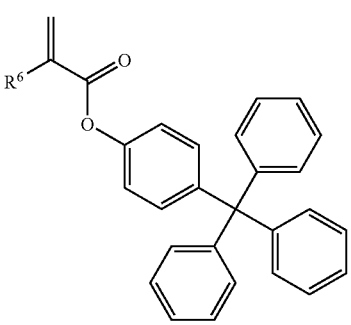
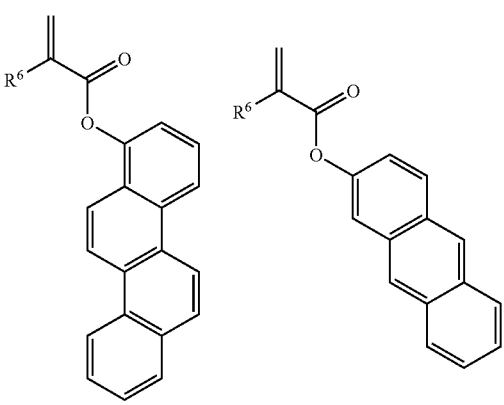

-continued
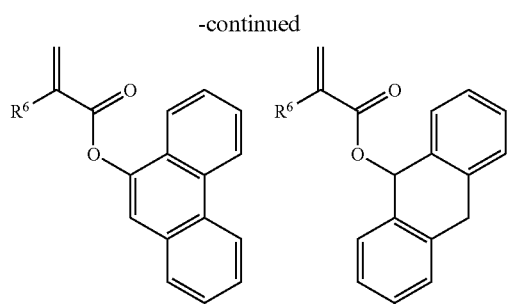
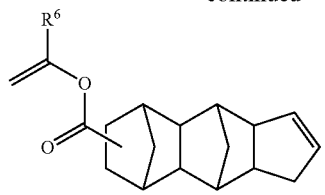
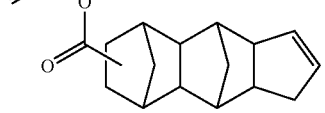
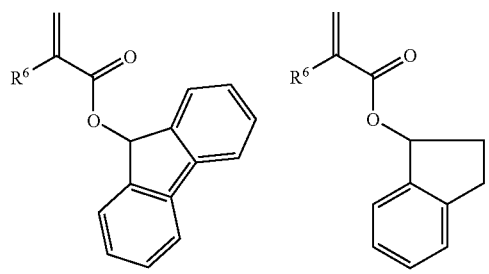
Where R⁵ in formula (1) is —O—C(=O)—R⁷, the corresponding recurring units are derived through copolymerization of vinyl esters having R⁷ wherein R⁷ is a $C_7$-$C_{30}$ organic group. Examples of suitable vinyl esters are illustrated below. In the following formulae, R⁶ is a hydrogen atom or methyl group.
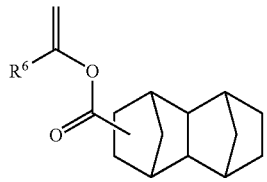 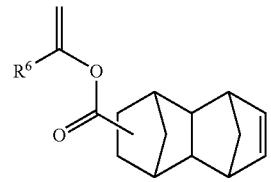
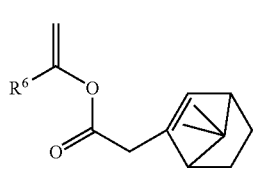 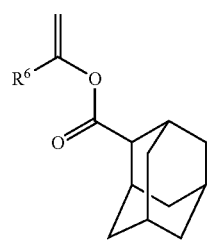
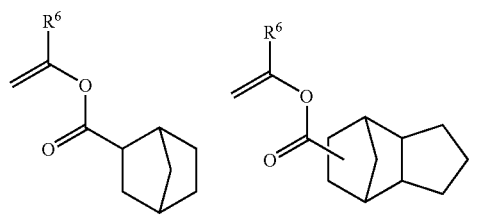
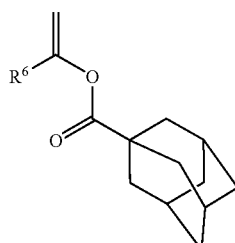
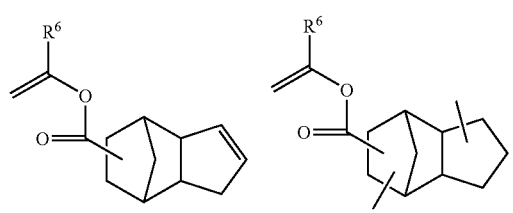
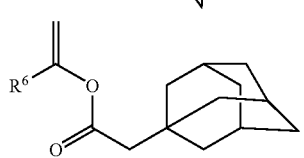
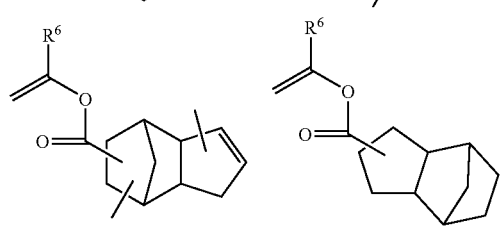
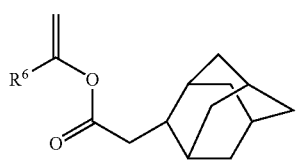 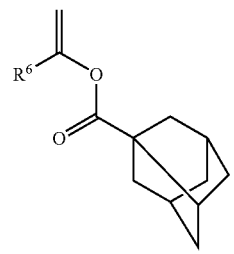
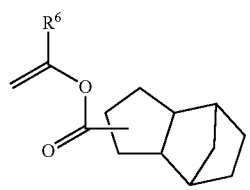

-continued
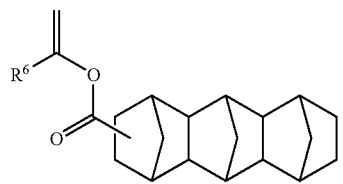
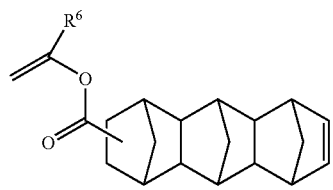
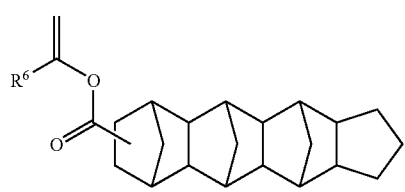
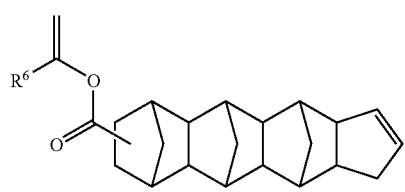
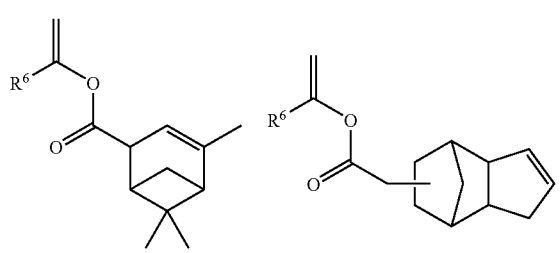
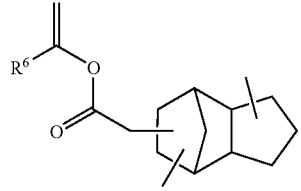
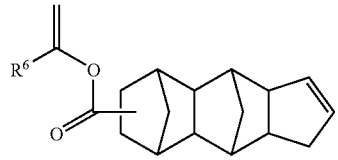
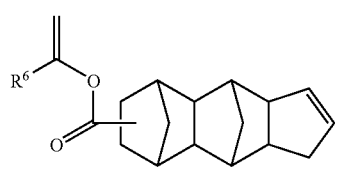
-continued
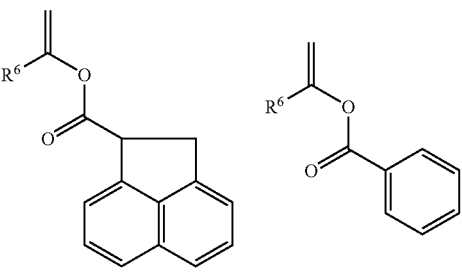
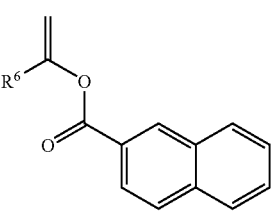
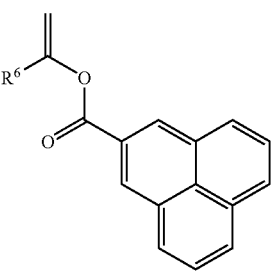
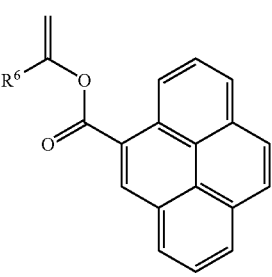
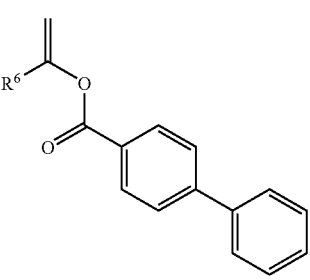
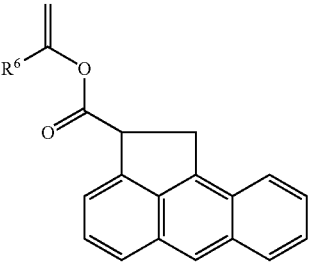

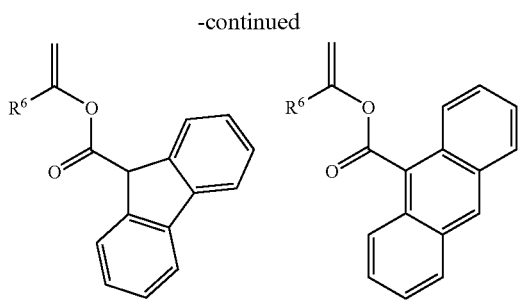
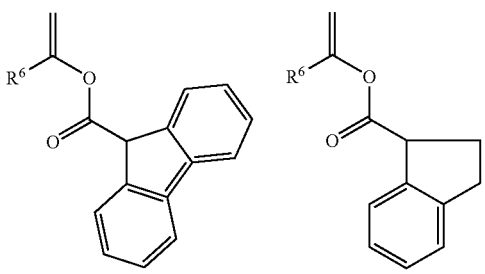

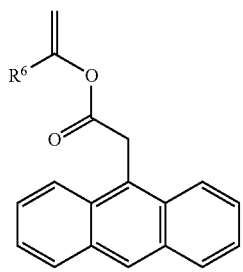

Understandably, hydroxyvinylnaphthalenes can be copolymerized not only with hydroxy-free olefins as represented by units "b", "c", "d" and "e", but also with other olefin compounds such as (meth)acrylates, vinyl ethers, styrenes, vinylnaphthalenes, maleic anhydride, itaconic anhydride, maleimides, vinylpyrrolidone, vinyl ethers, divinyl ethers, di(meth)acrylates, and divinylbenzenes.

The polymer may further have other hydroxy-containing recurring units, as shown below, copolymerized and incorporated therein.

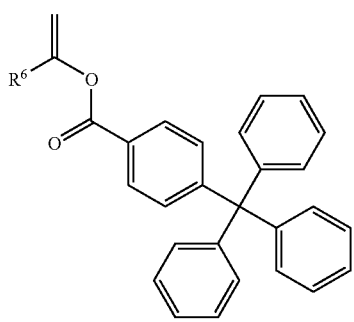

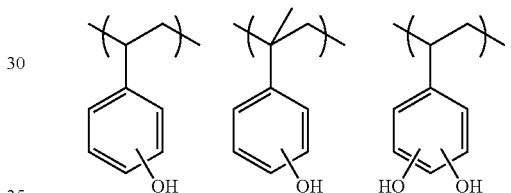

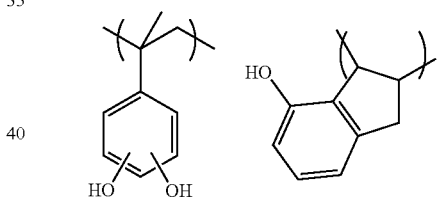

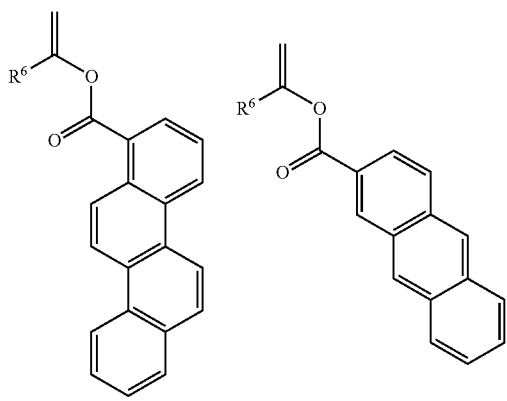

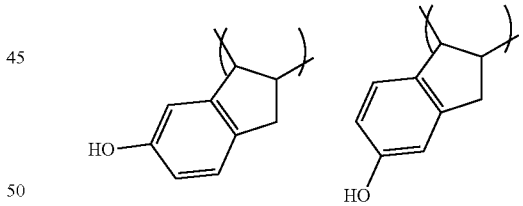

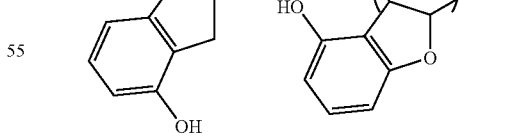

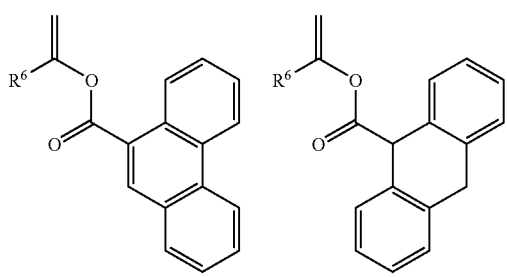

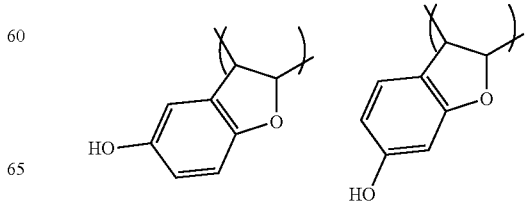

-continued

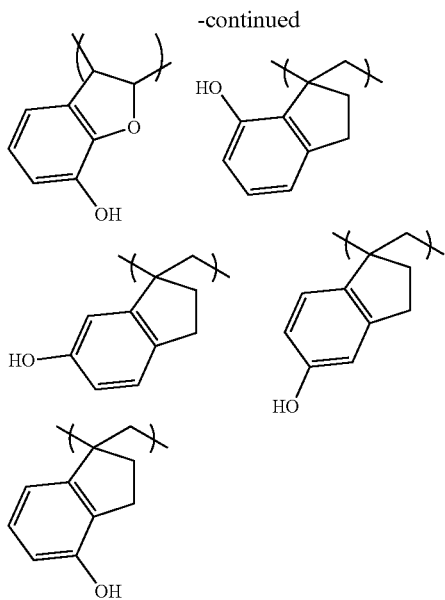

The subscripts a, b, c, d, and e are numbers in the range defined above, preferably in the range: $0.1 \leq a \leq 0.9$, $0 \leq b \leq 0.7$, $0 \leq c \leq 0.7$, $0 \leq d \leq 0.7$, $0 \leq e \leq 0.7$, and $0.1 \leq b+c+d+e \leq 0.9$, and more preferably in the range: $0.15 \leq a \leq 0.8$, $0 \leq b \leq 0.6$, $0 \leq c \leq 0.6$, $0 \leq d \leq 0.6$, $0 \leq e \leq 0.6$, and $0.2 \leq b+c+d+e \leq 0.8$.

The optional recurring units, designated "f", derived from the other olefin compound may be incorporated in a proportion: $0 \leq f \leq 0.8$, and more preferably $0 \leq f \leq 0.7$.

The optional other hydroxy-containing recurring units, designated "g", may be incorporated in a proportion: $0 \leq g \leq 0.8$, and more preferably $0 \leq g \leq 0.7$.

It is preferred that $a+b+c+d+e+f+g=1$. It is meant by $a+b+c+d+e+f+g=1$ that in a polymer comprising recurring units a, b, c, d, e, f and g, the total of recurring units a, b, c, d, e, f and g is 100 mol % of the total of entire recurring units of the polymer.

The monomers from which recurring units "a" in formula (1) are derived are hydroxyvinylnaphthalenes. Upon polymerization, the hydrogen atom of hydroxy group may have been replaced by an acetyl, formyl, pivaloyl, acetal, $C_4$-$C_{16}$ tertiary alkyl, trimethylsilyl or similar group.

In synthesizing the copolymer included in the resist undercoat-forming material of the invention, one typical method is by heat polymerization of hydroxyvinylnaphthalene and hydroxy-free olefin monomers in an organic solvent in the presence of a radical or cationic polymerization initiator. In a modified method, the hydroxy group of the hydroxy-containing monomer is replaced by an acetyl group prior to polymerization, and the resulting polymer is subjected to alkaline hydrolysis in an organic solvent for deprotecting the acetyl group. Examples of the organic solvent used for polymerization include toluene, benzene, tetrahydrofuran, diethyl ether, and dioxane. Examples of radical polymerization initiators include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Radical polymerization is preferably effected by heating at 50 to 80° C. Examples of cationic polymerization initiators include acids such as sulfuric acid, phosphoric acid, hydrochloric acid, nitric acid, hypochlorous acid, trichloroacetic acid, trifluoroacetic acid, methanesulfonic acid, trifluoromethanesulfonic acid, camphorsulfonic acid, and tosylic acid, Friedel-Crafts catalysts such as $BF_3$, $AlCl_3$, $TiCl_4$, and $SnCl_4$, and cation-generating substances such as $I_2$ and $(C_6H_5)_3CCl$.

The reaction time is generally about 2 to 100 hours, and preferably about 5 to 20 hours. For the alkaline hydrolysis, the base used may be aqueous ammonia, triethylamine or the like, the reaction temperature is in a range of −20° C. to 100° C., preferably 0° C. to 60° C., and the reaction time is about 0.2 to 100 hours, preferably about 0.5 to 20 hours.

The copolymers should preferably have a weight average molecular weight (Mw) in the range of about 1,500 to about 200,000, more preferably about 2,000 to about 100,000, as measured by gel permeation chromatography (GPC) versus polystyrene standards. Their molecular weight distribution or dispersity (Mw/Mn) is not particularly limited. The dispersity may be reduced by fractionation to remove lower and higher molecular weight fractions. It is also possible to use a mixture of two or more polymers of formula (1) having different molecular weight or dispersity or a mixture of two or more polymers of formula (1) having different compositional ratio.

The copolymer included in the resist undercoat-forming material of the invention, especially copolymer comprising recurring units having formula (1) can be hydrogenated to further improve its transparency at 193 nm. The degree of hydrogenation is preferably up to 80 mol %, more preferably up to 60 mol % of the aromatic groups. Although the lower limit may be 0 mol %, a degree of hydrogenation of at least 5 mol %, especially at least 10 mol % is preferred for achieving a certain transparency-improving effect.

While the base resin of the resist undercoat-forming material of the invention is characterized by the inclusion of the polymer obtained through copolymerization of recurring units derived from hydroxyvinylnaphthalene and recurring units derived from hydroxy-free olefins, the resin can be blended with any of conventional polymers which are used in the art as the antireflective coating material. For example, a polyacenaphthylene has a glass transition temperature (Tg) of at least 150° C., and when used alone, is sometimes ineffective in filling deep holes such as via holes. One effective approach of filling holes with a resin without leaving voids is by using a polymer having a low Tg and heating the polymer at a temperature below the crosslinking temperature to provide a heat flow, thereby filling holes to the bottom (see U.S. Pat. No. 6,316,165 or JP-A 2000-294504). Thus the inventive polymer may be blended with polymers having a low Tg, typically a Tg below 180° C., especially a Tg of 100 to 170° C., for example, polymers resulting from polymerization of one or more monomers selected from among acrylic derivatives, vinyl alcohol, vinyl ethers, allyl ethers, styrene derivatives, allyl benzene derivatives, and olefins (e.g., ethylene, propylene and butadiene), polymers obtained by metathesis ring-opening polymerization, novolac resins, dicyclopentadiene resins, low-nuclear compounds (e.g., phenols), calixarenes, and fullerenes, to form blends having a lower Tg and improved via hole filling performance.

The functions required for the resist undercoat layer include the elimination of intermixing with the resist topcoat layer and the elimination of diffusion of low molecular weight components into the resist topcoat layer (see Proc. SPIE Vol. 2195, pp. 225-229 (1994)). One common means for preventing intermixing and diffusion is by baking an undercoat film as spin coated onto a substrate for inducing thermal crosslinkage. This may be achieved by adding a crosslinker to the resist undercoat-forming material or by introducing crosslinkable substituent groups into the polymer. The method of introducing crosslinkable substituent groups into the polymer is, for example, by converting some hydroxy groups on hydroxyvinylnaphthalene units in formula (1) into glycidyl ether.

Crosslinker

Examples of the crosslinker which can be used herein include melamine compounds, guanamine compounds, glycoluril compounds and urea compounds having substituted thereon at least one group selected from among methylol, alkoxymethyl and acyloxymethyl groups, epoxy compounds, isocyanate compounds, azide compounds, and compounds having a double bond such as an alkenyl ether group. These compounds may be used as an additive or introduced as pendant groups on polymer side chains. Compounds having a hydroxy group are also useful as the crosslinker.

Of the foregoing compounds, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the isocyanate compound include tolylene diisocyanate, diphenylmethane diisocyanate, hexamethylene diisocyanate, and cyclohexane diisocyanate. Examples of the azide compound include 1,1'-biphenyl-4,4'-bisazide, 4,4'-methylidenebisazide, and 4,4'-oxybisazide.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

Where the polymer included in the resist undercoat-forming material of the invention, typically the polymer comprising recurring units having formula (1) has a hydroxyl group substituted with a glycidyl group, the addition of a compound having a hydroxyl group is effective. Compounds having at least two hydroxyl groups in a molecule are more preferred. Examples include alcoholic group-containing compounds such as naphthol novolac, m- and p-cresol novolac, naphthol-dicyclopentadiene novolac, m- and p-cresol-dicyclopentadiene novolac, 4,8-bis(hydroxymethyl)tricyclo[5.2.1.0$^{2,6}$]-decane, pentaerythritol, 1,2,6-hexanetriol, 4,4',4''-methylidene triscyclohexanol, 4,4'-[1-[4-[1-(4-hydroxycyclohexyl)-1-methylethyl]phenyl]-ethylidene]biscyclohexanol, [1,1'-bicyclohexyl]-4,4'-diol, methylenebiscyclohexanol, decahydronaphthalene-2,6-diol, and [1,1'-bicyclohexyl]-3,3',4,4'-tetrahydroxy; and low-nuclear phenol compounds such as bisphenol, methylene bisphenol, 2,2'-methylenebis[4-methylphenol], 4,4'-methylidene-bis[2,6-dimethylphenol], 4,4'-(1-methyl-ethylidene)bis[2-methylphenol], 4,4'-cyclohexylidene bisphenol, 4,4'-(1,3-dimethylbutylidene)bisphenol, 4,4'-(1-methylethylidene)bis[2,6-dimethylphenol], 4,4'-oxybisphenol, 4,4'-methylenebisphenol, bis(4-hydroxyphenyl)methanone, 4,4'-methylene bis[2-methylphenol], 4,4'-[1,4-phenylenebis(1-methylethylidene)]bisphenol, 4,4'-(1,2-ethanediyl)bisphenol, 4,4'-(diethylsilylene)bisphenol, 4,4'-[2,2,2-trifluoro-1-(trifluoromethyl)ethylidene]bisphenol, 4,4',4''-methylidene trisphenol, 4,4'-[1-(4-hydroxyphenyl)-1-methylethyl]phenyl]ethylidene]-bisphenol, 2,6-bis[(2-hydroxy-5-methylphenyl)methyl]-4-methylphenol, 4,4',4''-ethylidyne tris[2-methylphenol], 4,4',4''-ethylidyne trisphenol, 4,6-bis[(4-hydroxyphenyl)methyl]-1,3-benzenediol, 4,4'-[(3,4-dihydroxyphenyl)methylene]bis[2-methylphenol], 4,4',4'',4'''-(1,2-ethanediylidene)tetrakisphenol, 4,4',4'',4'''-(ethanediylidene)tetrakis[2-methylphenol], 2,2'-methylenebis[6-[(2-hydroxy-5-methylphenyl)methyl]-4-methylphenol], 4,4',4'',4'''-(1,4-phenylenedimethylidyne)tetrakisphenol, 2,4,6-tris(4-hydroxyphenylmethyl)-1,3-benzenediol, 2,4',4''-methylidenetrisphenol, 4,4',4''-(3-methyl-1-propanyl-3-ylidene)trisphenol, 2,6-bis[(4-hydroxy-3-fluorophenyl)methyl]-4-fluorophenol, 2,6-bis[4-hydroxy-3-fluorophenyl)methyl]-4-fluorophenol, 3,6-bis[(3,5-dimethyl-4-hydroxyphenyl)methyl]-1,2-benzenediol, 4,6-bis[(3,5-dimethyl-4-hydroxyphenyl)methyl]-1,3-benzenediol, p-methylcalix[4]arene, 2,2'-methylenebis[6-[(2,5/3,6-dimethyl-4/2-hydroxyphenyl)-methyl]-4-methylphenol, 2,2'-methylenebis[6-[(3,5-dimethyl-4-hydroxyphenyl)methyl]-4-methylphenol, 4,4',4'',4'''-tetrakis[(1-methylethylidene)bis(1,4-cyclohexyl-idene)]phenol, 6,6'-methylenebis[4-(4-hydroxyphenylmethyl)-1,2,3-benzenetriol, and 3,3',5,5'-tetrakis[(5-methyl-2-hydroxyphenyl)methyl]-[(1,1'-biphenyl)-4,4'-diol].

In the resist undercoat-forming material of the invention, the crosslinker is preferably compounded in an amount of 5 to 50 parts by weight, more preferably 10 to 40 parts by weight per 100 parts by weight of the base polymer (entire resin). Less than 5 pbw of the crosslinker may allow for mixing with the resist film. More than 50 pbw of the crosslinker may degrade the antireflection effect or allow the crosslinked film to crack.

Acid Generator

An acid generator may be added to the resist undercoat-forming material of the invention to accelerate the thermally induced crosslinking reaction. Acid generators include those which generate an acid through pyrolysis and those which generate an acid upon exposure to light, and both are useful.

The acid generators used herein include (i) onium salts of the formula (P1a-1), (P1a-2), (P1a-3) or (P1b), (ii) diazomethane derivatives of the formula (P2), (iii) glyoxime derivatives of the formula (P3), (iv) bissulfone derivatives of the formula (P4), (v) sulfonic acid esters of N-hydroxyimide compounds of the formula (P5), (vi) β-ketosulfonic acid derivatives, (vii) disulfone derivatives, (viii) nitrobenzylsulfonate derivatives, and
(ix) sulfonate derivatives.

These acid generators are described in detail.

(i) Onium Salts of Formula (P1a-1), (P1a-2) or (P1a-3):

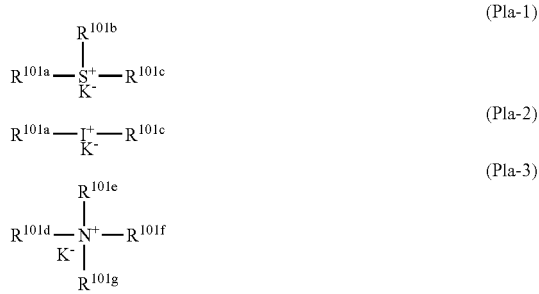

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion. $R^{101d}$, $R^{101e}$, $R^{101f}$, and $R^{101g}$ stand for the same as $R^{101a}$, $R^{101b}$, and $R^{101c}$ as well as hydrogen atoms. A pair of $R^{101d}$ and $R^{101e}$ or a combination of $R^{101d}$, $R^{101e}$ and $R^{101f}$ may form a ring, and each of $R^{101d}$ and $R^{101e}$ or each of $R^{101d}$, $R^{101e}$ and $R^{101f}$ is an alkylene group of 3 to 10 carbon atoms when they form a ring. $R^{101d}$, $R^{101e}$, $R^{101f}$, and $R^{101g}$, taken together, may stand for a heterocyclic aromatic ring having the nitrogen atom (in the formula) incorporated therein.

$R^{101a}$, $R^{101b}$, $R^{101c}$, $R^{101d}$, $R^{101e}$, $R^{101f}$, and $R^{101g}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary oxoalkenyl groups include 2-oxo-4-cyclohexenyl and 2-oxo-4-propenyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide acids such as bis(trifluoromethylsulfonyl)imide, bis(perfluoroethylsulfonyl)imide and bis(perfluorobutylsulfonyl)imide; methide acids such as tris(trifluoromethylsulfonyl)methide and tris(perfluoroethylsulfonyl)mathide; sulfonates having fluorine substituted at alpha-position as represented by the following formula (K-1) and sulfonates having fluorine substituted at alpha- and beta-positions as represented by the following formula (K-2).

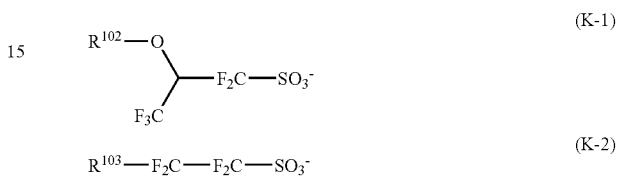

In formula (K-1), $R^{102}$ is a hydrogen atom, straight, branched or cyclic $C_1$-$C_{20}$ alkyl or acyl group, $C_2$-$C_{20}$ alkenyl group, or $C_6$-$C_{20}$ aryl or aryloxy group. In formula (K-2), $R^{103}$ is a hydrogen atom, straight, branched or cyclic $C_1$-$C_{20}$ alkyl group, $C_2$-$C_{20}$ alkenyl group, or $C_6$-$C_{20}$ aryl group.

Examples of the heterocyclic aromatic ring having the nitrogen atom (in formula (P1a-3)) incorporated therein, represented by $R^{101d}$, $R^{101e}$, $R^{101f}$, and $R^{101g}$ include imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

The salts of (P1a-1) and (P1a-2) have both the functions of a photoacid generator and a thermal acid generator while the salts of (P1a-3) function as a thermal acid generator.

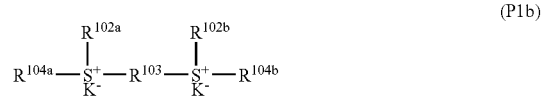

Herein, $R^{102a}$ and $R^{102b}$ independently represent straight, branched or cyclic alkyl groups of 1 to 8 carbon atoms. $R^{103}$ represents a straight, branched or cyclic alkylene group of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the alkyl groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the alkylene groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the 2-oxoalkyl groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1), (P1a-2) and (P1a-3).

(ii) Diazomethane Derivatives of Formula (P2)

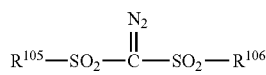

(P2)

Herein, $R^{105}$ and $R^{106}$ independently represent straight, branched or cyclic $C_1$-$C_{12}$ alkyl or halogenated alkyl groups, $C_6$-$C_{20}$ aryl or halogenated aryl groups, or $C_1$-$C_{12}$ aralkyl groups.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

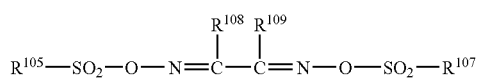

(P3)

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring. $R^{105}$ is as illustrated in formula (P2).

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$.

Examples of the alkylene groups represented by $R^{108}$ and $R^{109}$ include methylene, ethylene, propylene, butylene, and hexylene.

(iv) Bissulfone Derivatives of Formula (P4)

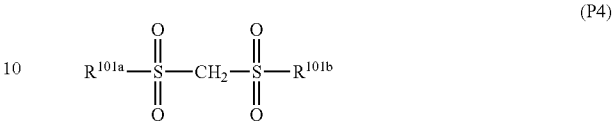

(P4)

Herein, $R^{101a}$ and $R^{101b}$ are as defined above.

(v) Sulfonic Acid Esters of N-hydroxyimide Compounds of Formula (P5)

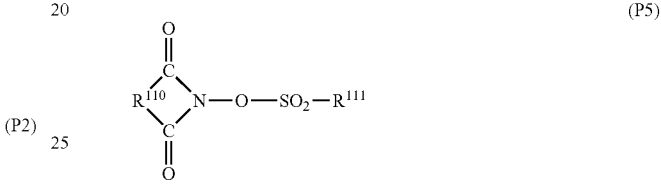

(P5)

Herein, $R^{110}$ is an $C_6$-$C_{10}$ arylene group, $C_1$-$C_6$ alkylene group, or $C_2$-$C_6$ alkenylene group wherein some or all of the hydrogen atoms may be replaced by straight or branched $C_1$-$C_4$ alkyl or alkoxy groups, nitro, acetyl, or phenyl groups. $R^{111}$ is a straight, branched or cyclic $C_1$-$C_8$ alkyl group, alkenyl, alkoxyalkyl, phenyl or naphthyl group wherein some or all of the hydrogen atoms may be replaced by $C_1$-$C_4$ alkyl or alkoxy groups, phenyl groups (which may have substituted thereon a $C_1$-$C_4$ alkyl or alkoxy, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the $C_1$-$C_4$ alkyl groups include methyl, ethyl, propyl, isopropyl, n-butyl, isobutyl and tert-butyl; the $C_1$-$C_4$ alkoxy groups include methoxy, ethoxy, propoxy, isopropoxy, n-butoxy, isobutoxy, and tert-butoxy; the phenyl groups which may have substituted thereon a $C_1$-$C_4$ alkyl or alkoxy, nitro, or acetyl group include phenyl, tolyl, p-tert-butoxyphenyl, p-acetylphenyl and p-nitrophenyl;

the hetero-aromatic groups of 3 to 5 carbon atoms include pyridyl and furyl.

Illustrative examples of the acid generator include:
onium salts such as
tetramethylammonium trifluoromethanesulfonate,
tetramethylammonium nonafluorobutanesulfonate,
triethylammonium nonafluorobutanesulfonate,
pyridinium nonafluorobutanesulfonate,
triethylammonium camphorsulfonate,
pyridinium camphorsulfonate,
tetra-n-butylammonium nonafluorobutanesulfonate,
tetraphenylammonium nonafluorobutanesulfonate,
tetramethylammonium p-toluenesulfonate,
diphenyliodonium trifluoromethanesulfonate,
(p-tert-butoxyphenyl)phenyliodonium trifluoromethanesulfonate,
diphenyliodonium p-toluenesulfonate,
(p-tert-butoxyphenyl)phenyliodonium p-toluenesulfonate,
triphenylsulfonium trifluoromethanesulfonate,
(p-tert-butoxyphenyl)diphenylsulfonium trifluoromethanesulfonate,
bis(p-tert-butoxyphenyl)phenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
bis(p-tert-butoxyphenyl)phenylsulfonium p-toluenesulfonate,
tris(p-tert-butoxyphenyl)sulfonium p-toluenesulfonate,
triphenylsulfonium nonafluorobutanesulfonate,
triphenylsulfonium butanesulfonate,
trimethylsulfonium trifluoromethanesulfonate,
trimethylsulfonium p-toluenesulfonate,
cyclohexylmethyl(2-oxocyclohexyl)sulfonium trifluoromethane-sulfonate,
cyclohexylmethyl(2-oxocyclohexyl)sulfonium p-toluenesulfonate,
dimethylphenylsulfonium trifluoromethanesulfonate,
dimethylphenylsulfonium p-toluenesulfonate,
dicyclohexylphenylsulfonium trifluoromethanesulfonate,
dicyclohexylphenylsulfonium p-toluenesulfonate,
trinaphthylsulfonium trifluoromethanesulfonate,
(2-norbornyl)methyl(2-oxocyclohexyl)sulfonium trifluoromethanesulfonate,
ethylenebis[methyl(2-oxocyclopentyl)sulfonium trifluoromethanesulfonate],
1,2'-naphthylcarbonylmethyltetrahydrothiophenium triflate,
triethylammonium nonaflate, tributylammonium nonaflate,
tetraethylammonium nonaflate, tetrabutylammonium nonaflate,
triethylammonium bis(trifluoromethylsulfonyl)imide, and
triethylammonium tris(perfluoroethylsulfonyl)methide;
diazomethane derivatives such as
bis(benzenesulfonyl)diazomethane,
bis(p-toluenesulfonyl)diazomethane,
bis(xylenesulfonyl)diazomethane,
bis(cyclohexylsulfonyl)diazomethane,
bis(cyclopentylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane,
bis(tert-butylsulfonyl)diazomethane,
bis(n-amylsulfonyl)diazomethane,
bis(isoamylsulfonyl)diazomethane,
bis(sec-amylsulfonyl)diazomethane,
bis(tert-amylsulfonyl)diazomethane,
1-cyclohexylsulfonyl-1-(tert-butylsulfonyl)diazomethane,
1-cyclohexylsulfonyl-1-(tert-amylsulfonyl)diazomethane, and
1-tert-amylsulfonyl-1-(tert-butylsulfonyl)diazomethane;
glyoxime derivatives such as
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexanesulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime;
bissulfone derivatives such as
bisnaphthylsulfonylmethane, bistrifluoromethylsulfonylmethane,
bismethylsulfonylmethane, bisethylsulfonylmethane,
bispropylsulfonylmethane, bisisopropylsulfonylmethane,
bis-p-toluenesulfonylmethane, and bisbenzenesulfonylmethane;
β-ketosulfonic acid derivatives such as
2-cyclohexylcarbonyl-2-(p-toluenesulfonyl)propane and
2-isopropylcarbonyl-2-(p-toluenesulfonyl)propane;
disulfone derivatives such as
diphenyl disulfone derivatives and
dicyclohexyl disulfone derivatives;
nitrobenzyl sulfonate derivatives such as
2,6-dinitrobenzyl p-toluenesulfonate and
2,4-dinitrobenzyl p-toluenesulfonate;
sulfonic acid ester derivatives such as
1,2,3-tris(methanesulfonyloxy)benzene,
1,2,3-tris(trifluoromethanesulfonyloxy)benzene, and
1,2,3-tris(p-toluenesulfonyloxy)benzene; and
sulfonic acid esters of N-hydroxyimides such as
N-hydroxysuccinimide methanesulfonate,
N-hydroxysuccinimide trifluoromethanesulfonate,
N-hydroxysuccinimide ethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide 1-octanesulfonate,
N-hydroxysuccinimide p-toluenesulfonate,
N-hydroxysuccinimide p-methoxybenzenesulfonate,
N-hydroxysuccinimide 2-chloroethanesulfonate,
N-hydroxysuccinimide benzenesulfonate,
N-hydroxysuccinimide 2,4,6-trimethylbenzenesulfonate,
N-hydroxysuccinimide 1-naphthalenesulfonate,
N-hydroxysuccinimide 2-naphthalenesulfonate,
N-hydroxy-2-phenylsuccinimide methanesulfonate, N-hydroxymale imide methanesulfonate,
N-hydroxymaleimide ethanesulfonate,
N-hydroxy-2-phenylmaleimide methanesulfonate,
N-hydroxyglutar imide methanesulfonate,
N-hydroxyglutarimide benzenesulfonate,
N-hydroxyphthalimide methanesulfonate,
N-hydroxyphthalimide benzenesulfonate,
N-hydroxyphthalimide trifluoromethanesulfonate,
N-hydroxyphthalimide p-toluenesulfonate,
N-hydroxynaphthalimide methanesulfonate,
N-hydroxynaphthalimide benzenesulfonate,
N-hydroxy-5-norbornene-2,3-dicarboxyimide methanesulfonate,
N-hydroxy-5-norbornene-2,3-dicarboxyimide trifluoromethane-sulfonate, and
N-hydroxy-5-norbornene-2,3-dicarboxyimide p-toluenesulfonate.

Preferred among these acid generators are onium salts such as triphenylsulfonium trifluoromethanesulfonate,
(p-tert-butoxyphenyl)diphenylsulfonium trifluoromethanesulfonate,
tris(p-tert-butoxyphenyl)sulfonium trifluoromethanesulfonate,
triphenylsulfonium p-toluenesulfonate,
(p-tert-butoxyphenyl)diphenylsulfonium p-toluenesulfonate,
tris(p-tert-butoxyphenyl)sulfonium p-toluenesulfonate,
trinaphthylsulfonium trifluoromethanesulfonate,
cyclohexylmethyl(2-oxocyclohexyl)sulfonium trifluoromethane-sulfonate,
(2-norbornyl)methyl(2-oxocylohexyl)sulfonium trifluoromethanesulfonate, and
1,2'-naphthylcarbonylmethyltetrahydrothiophenium triflate;
diazomethane derivatives such as
bis(benzenesulfonyl)diazomethane,
bis(p-toluenesulfonyl)diazomethane,
bis(cyclohexylsulfonyl)diazomethane,
bis(n-butylsulfonyl)diazomethane,
bis(isobutylsulfonyl)diazomethane,
bis(sec-butylsulfonyl)diazomethane,
bis(n-propylsulfonyl)diazomethane,
bis(isopropylsulfonyl)diazomethane, and
bis(tert-butylsulfonyl)diazomethane;
glyoxime derivatives such as
bis-O-(p-toluenesulfonyl)-α-dimethylglyoxime and
bis-O-(n-butanesulfonyl)-α-dimethylglyoxime;
bissulfone derivatives such as bisnaphthylsulfonylmethane;
and sulfonic acid esters of N-hydroxyimide compounds such as
N-hydroxysuccinimide methanesulfonate,
N-hydroxysuccinimide trifluoromethanesulfonate,
N-hydroxysuccinimide 1-propanesulfonate,
N-hydroxysuccinimide 2-propanesulfonate,
N-hydroxysuccinimide 1-pentanesulfonate,
N-hydroxysuccinimide p-toluenesulfonate,
N-hydroxynaphthalimide methanesulfonate, and
N-hydroxynaphthalimide benzenesulfonate.

These acid generators may be used singly or in combinations of two or more thereof. The acid generator is preferably added in an amount of 0.1 to 50 parts by weight, and especially 0.5 to 40 parts by weight, per 100 parts by weight of the base polymer. Less than 0.1 pbw of the acid generator may generate an insufficient amount of acid to induce crosslinking reaction whereas more than 50 pbw of the acid generator may invite a mixing phenomenon that the acid migrates into the overlaying resist.

Basic Compound

In the resist undercoat-forming material of the invention, a basic compound may be compounded for improving the storage stability. The basic compound plays the role of an acid quencher for preventing a small amount of acid generated from the acid generator from promoting the crosslinking reaction during shelf storage.

Examples of suitable basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compound is preferably formulated in an amount of 0.001 to 2 parts by weight, and especially 0.01 to 1 part by weight, per 100 parts by weight of the entire base polymer. Less than 0.001 pbw of the basic compound may fail to provide the desired effect whereas more than 2 pbw of the basic compound may trap the entirety of thermally generated acid to inhibit crosslinking reaction.

Organic Solvent

The organic solvent used in the resist undercoat-forming material of the invention may be any organic solvent in which the base polymer, acid generator, crosslinker and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol, ethyl lactate and propylene glycol monomethyl ether acetate, and mixtures thereof.

The organic solvent is preferably added in an amount of about 200 to 10,000 parts by weight, especially about 300 to 5,000 parts by weight per 100 parts by weight of the entire base polymer.

Another aspect of the invention is a process for forming a pattern in a substrate by lithography. Specifically, the patterning process involves at least the steps of applying the resist undercoat-forming material onto a patternable substrate to form a resist undercoat layer, applying a topcoat layer of a photoresist composition over the undercoat layer for thereby forming a multilayer resist coating, exposing a pattern circuitry region of the multilayer resist coating to radiation, developing the coating with a liquid developer to form a resist pattern in the resist topcoat layer, etching the resist undercoat layer through the patterned resist topcoat layer as a mask, and further etching the substrate through the patterned multilayer resist coating as a mask for thereby forming a pattern in the substrate.

In an alternative embodiment, the patterning process involves the steps of applying the resist undercoat-forming material onto a patternable substrate to form a resist undercoat layer, forming a silicon-containing intermediate layer on the undercoat layer, applying a layer of a photoresist composition over the intermediate layer, exposing a predetermined region of the photoresist layer to radiation, developing the photoresist layer with a liquid developer to form a resist pattern, processing the intermediate layer through the patterned photoresist layer as a mask, by means of a dry etching apparatus, removing the patterned photoresist layer, and processing the undercoat layer and then the substrate through the patterned intermediate layer as a mask, by means of a dry etching apparatus.

Now referring to FIGS. 6 and 7, the patterning processes of the invention are illustrated. FIGS. 6 and 7 illustrate the bilayer resist working process and trilayer resist working process, respectively.

The process starts with a patternable or processable substrate 11 which may consist of a patternable layer 11a and a support layer 11b as shown in the figures. The support layer 11b is not particularly limited. A suitable material may be selected from among Si, amorphous silicon ($\alpha$-Si), polycrystalline silicon (p-Si), $SiO_2$, SiN, SiON, W, TiN, Al and the like, and even a material different from the processable layer 11a may be used. The processable layer 11a is selected from low-k films of Si, $SiO_2$, SiON, SiN, p-Si, $\alpha$-Si, W, W—Si, Al, Cu, Al—Si and the like and etching stop films thereof, and typically formed to a thickness of 50 to 10,000 nm, especially 100 to 5,000 nm.

Reference is first made to the bilayer resist working process as shown in FIG. 6. Like ordinary photoresists, the undercoat-forming material of the invention can be applied onto a processable substrate 11 by any desired technique such as spin coating, to form an undercoat layer 12 thereon. After spin coating, the coating 12 is desirably baked in order to evaporate off the solvent and to promote crosslinking reaction for preventing the undercoat layer from mixing with the overlying resist 13. The baking is preferably effected at a temperature of 80 to 300° C. for a time of 10 to 300 seconds. The thickness of the undercoat layer 12 may be suitably determined although it is preferably in the range of 100 to 20,000 nm, especially 150 to 15,000 nm.

Figure 6A:
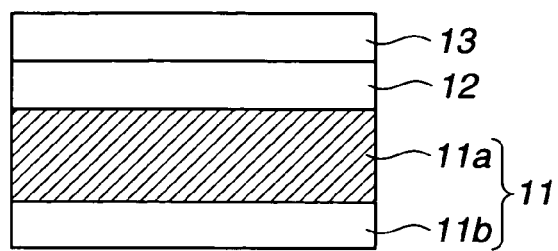
FIG. 6 illustrates steps of a bilayer resist working process.

Once the resist undercoat layer 12 is formed, a resist topcoat layer 13 is formed thereon (see FIG. 6A). The photoresist composition from which the resist topcoat layer 13 is formed may be any of well-known resist compositions. A positive photoresist composition comprising a silicon atom-bearing polymer such as a polysilsesquioxane derivative or vinylsilane derivative as a base polymer, an organic solvent, an acid generator, and optionally, a basic compound or the like is often used from the standpoint of oxygen gas etching resistance. As the silicon atom-bearing polymer, any of well-known polymers which are used in resist compositions of this type may be used. The resist topcoat layer 13 preferably has a thickness in the range of 30 to 500 nm, especially 50 to 400 nm although the thickness is not particularly limited.

In forming the resist topcoat layer 13 from the photoresist composition, a spin coating or similar technique is preferably used as in the case of the resist undercoat layer. Once the resist topcoat layer 13 is formed by spin coating or the like, it is prebaked, preferably at a temperature of 80 to 180° C. for about 10 to 300 seconds.

Figure 6B:
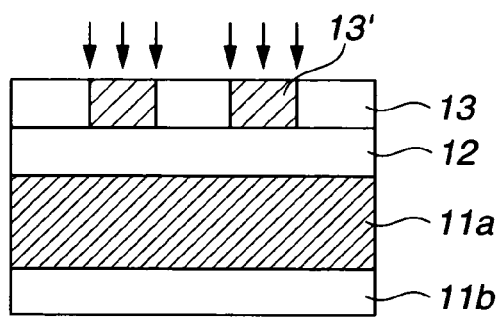
Figure 6C:
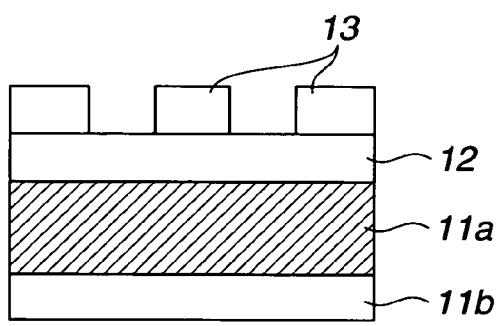

Thereafter, in accordance with the standard procedure, the multilayer resist coating in a pattern circuitry region is exposed to radiation (FIG. 6B), post-exposure baked (PEB), and developed, yielding a resist pattern (FIG. 6C). In FIG. 6B, 13' denotes exposed areas.

Development is carried out by a puddle or dip technique using an aqueous alkaline solution, typically a 2.38 wt % aqueous solution of tetramethylammonium hydroxide, at room temperature for 10 to 300 seconds. The resist coating as developed is then rinsed with deionized water and dried by spin drying or nitrogen blowing.

Figure 6D:
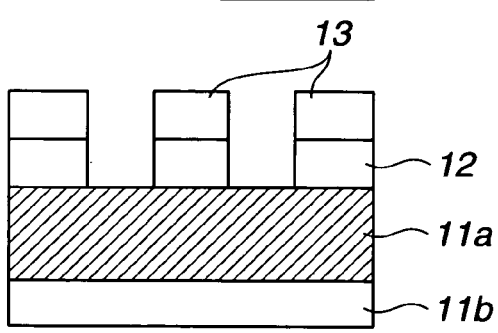

Next, the resist undercoat layer 12 is etched, for example, by dry etching with an oxygen-based gas while the resist topcoat layer 13 which has been patterned serves as a mask (see FIG. 6D). The etching may be carried out by a standard technique. In the case of dry etching with an oxygen-based gas, besides oxygen gas, an inert gas such as He or Ar and another gas such as CO, $CO_2$, $NH_3$, $SO_2$, $N_2$ or $NO_2$ may be added to the etching gas. The other gas is used for sidewall protection, that is, for preventing the pattern sidewalls from being undercut.

Figure 6E:
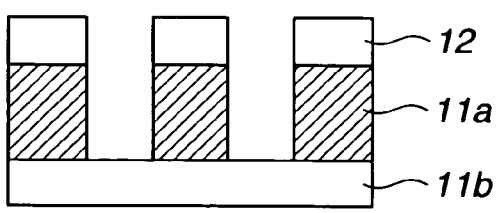

Finally, the substrate 11 is etched by a conventional technique (see FIG. 6E). For example, where the substrate is $SiO_2$ or SiN, etching with a fluorocarbon-base gas is employed. Where the substrate is p-Si, Al or W, etching with a chlorine or bromine-base gas is employed. The resist undercoat layer is characterized by high etching resistance during any type of substrate etching. As the case may be, the resist topcoat layer is removed before the substrate is etched, or the resist topcoat layer is left as such when the substrate is etched.

Figure 7A:
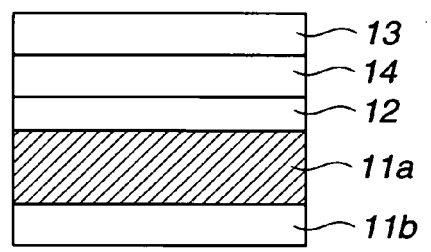
FIG. 7 illustrates steps of a trilayer resist working process.

In the trilayer resist working process, as shown in FIG. 7, a silicon-containing intermediate layer 14 is interposed between the resist undercoat layer 12 and the resist topcoat layer 13 (see FIG. 7A). The intermediate layer 14 may be any of films formed by spin coating of silicone polymers based on polysilsesquioxane, tetraorthosilicate glass (TEOS) or the like, and films of $SiO_2$, SiN and SiON deposited by CVD. Preferably the intermediate layer 14 has a thickness of 10 to 1,000 nm. The construction of the remaining components is the same as in the bilayer resist working process shown in FIG. 6.

Figure 7B:
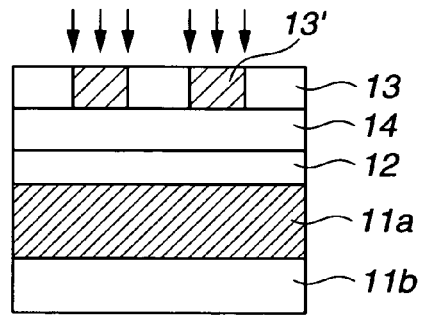
Figure 7C:
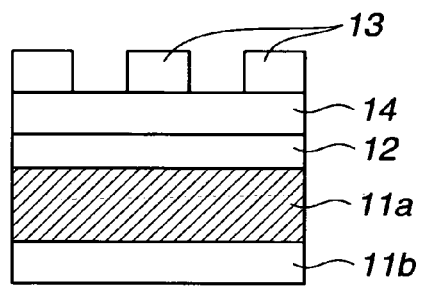
Figure 7D:
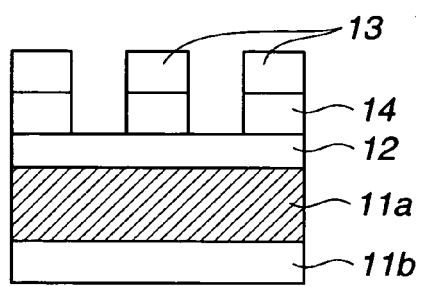
Figure 7E:
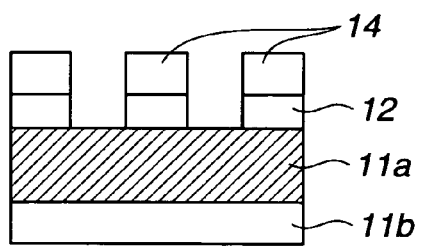

Then the resist topcoat layer 13 is processed by the same procedure described for FIG. 6, forming a resist pattern (see FIGS. 7B and 7C).

Next, the intermediate layer 14 is etched (see FIG. 7D), for example, by dry etching with a fluorocarbon-based gas while the resist topcoat layer 13 which has been patterned serves as a mask. This etching may be carried out by a standard technique. In the dry etching with a fluorocarbon-based gas, use may be generally made of $CF_4$, $CHF_3$, $C_2F_6$, $C_3F_8$ or $C_4F_{10}$.

After the intermediate layer 14 has been etched, the resist undercoat layer 12 is etched (see FIG. 7E), for example, by dry etching with an oxygen or hydrogen-based gas. In addition to $O_2$ or $H_2$, an inert gas such as He or Ar and another gas such as CO, $CO_2$, $NH_3$, $SO_2$, $N_2$ or $NO_2$ may be added to the etching gas. The other gas is used for sidewall protection, that is, for preventing the pattern sidewalls from being undercut.

Figure 7F:
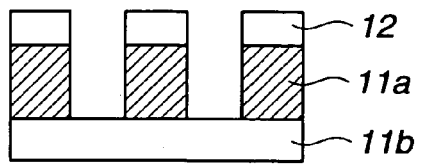

Finally, the substrate 11 is etched by a conventional technique (see FIG. 7F). For example, where the substrate is $SiO_2$ or SiN, etching with a fluorocarbon-base gas is employed. Where the substrate is p-Si, Al or W, etching with a chlorine or bromine-base gas is employed. The resist undercoat layer is characterized by high etching resistance during any type of substrate etching. As the case may be, the resist topcoat layer is removed before the substrate is etched, or the resist topcoat layer is left as such when the substrate is etched.

EXAMPLE

Synthesis Examples and Examples are given below together with Comparative Examples for further illustrating the invention although the invention is not limited thereby.

The weight average molecular weight (Mw) and number average molecular weight (Mn) of a polymer are determined by gel permeation chromatography (GPC) versus polystyrene standards, and a dispersity (Mw/Mn) is computed therefrom.

Synthesis Example 1

A 200-ml flask was charged with 9.1 g of acenaphthylene, 6.9 g of 5-hydroxy-1-vinylnaphthalene, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½ and poured into a mixture of 2.5 L methanol and 0.2 L water for precipitation. The resulting white solids were filtered and vacuum dried at 60° C., yielding a white polymer, designated Polymer 1.

The polymer was analyzed by $^{13}$C- and $^1$H-NMR and GPC, with the results being shown below.

Copolymer compositional ratio (molar ratio) 5-hydroxy-1-vinylnaphthalene:acenaphthylene=40:60

Mw=6,800

Mw/Mn=1.72

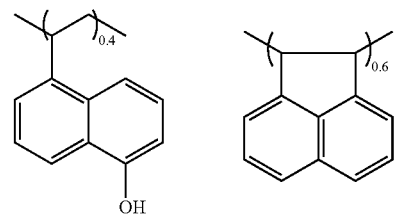

Polymer 1

Synthesis Example 2

A 200-ml flask was charged with 9.1 g of acenaphthylene, 6.9 g of 6-hydroxy-2-vinylnaphthalene, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½ and poured into a mixture of 2.5 L methanol and 0.2 L water for precipitation. The resulting white solids were filtered and vacuum dried at 60° C., yielding a white polymer, designated Polymer 2.

The polymer was analyzed by $^{13}$C- and $^1$H-NMR and GPC, with the results being shown below.
Copolymer compositional ratio (molar ratio) 6-hydroxy-2-vinylnaphthalene:acenaphthylene=40:60
Mw=7,400
Mw/Mn=1.83

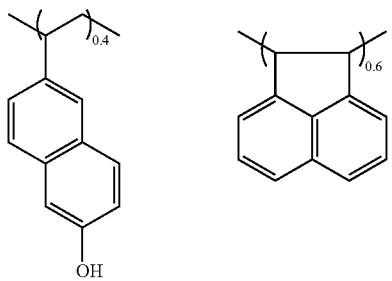

Polymer 2

Synthesis Example 3

A 200-ml flask was charged with 7.0 g of indene, 6.9 g of 6-hydroxy-2-vinylnaphthalene, and 20 g of 1,2-dichloroethane as a solvent. In a nitrogen atmosphere, 0.5 g of boron trifluoride as a polymerization initiator was added to the reactor, which was heated to 600C, whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer 3.

The polymer was analyzed by $^{13}$C- and $^1$H-NMR and GPC, with the results being shown below.
Copolymer compositional ratio (molar ratio) 6-hydroxy-2-vinylnaphthalene:indene=40:60
Mw=15,000
Mw/Mn=1.92

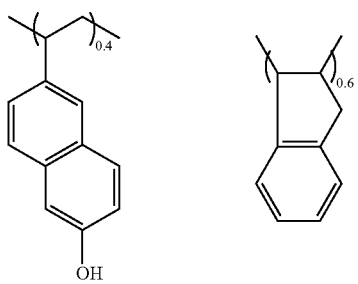

Polymer 3

Synthesis Example 4

A 500-ml flask was charged with 11.0 g of 6-hydroxy-2-vinylnaphthalene, 3.2 g of 2,5-norbornadiene, and 20 g of toluene as a solvent. In a nitrogen atmosphere, the reactor was cooled to −70° C., followed by vacuum evacuation and nitrogen flow, which were repeated three times. The reactor was warmed up to room temperature, 1.5 g of AIBN as a polymerization initiator was added, and the reactor was heated to 800C, whereupon reaction occurred for 24 hours. The reaction solution was concentrated to ½, and poured into a mixture of 300 mL methanol and 50 mL water for precipitation. The resulting white solids were filtered and vacuum dried at 60° C., yielding a white polymer, designated Polymer 4.

The polymer was analyzed by $^1$H-NMR and GPC, with the results being shown below.
Copolymer compositional ratio (molar ratio) 6-hydroxy-2-vinylnaphthalene:2,5-norbornadiene=0.68:0.32
Mw=10,500
Mw/Mn=1.71

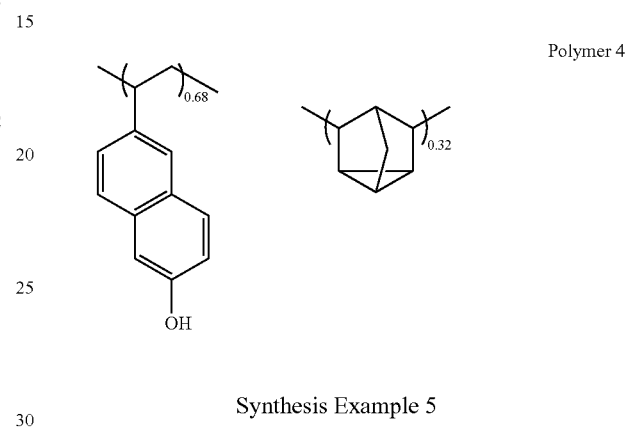

Polymer 4

Synthesis Example 5

A 500-ml flask was charged with 5.9 g of 5-hydroxy-1-vinylnaphthalene, 5.4 g of 1-vinylnaphthalene, 3.2 g of 2,5-norbornadiene, and 20 g of toluene as a solvent. In a nitrogen atmosphere, the reactor was cooled to −70° C., followed by vacuum evacuation and nitrogen flow, which were repeated three times. The reactor was warmed up to room temperature, 1.5 g of AIBN as a polymerization initiator was added, and the reactor was heated to 80° C., whereupon reaction occurred for 24 hours. The reaction solution was concentrated to ½, and poured into a mixture of 300 mL methanol and 50 mL water for precipitation. The resulting white solids were filtered and vacuum dried at 60° C., yielding a white polymer, designated Polymer 5.

The polymer was analyzed by $^1$H-NMR and GPC, with the results being shown below.
Copolymer compositional ratio (molar ratio) 5-hydroxy-1-vinylnaphthalene: 1-vinylnaphthalene 2,5-norbornadiene=0.35:0.35:0.30
Mw=11,600
Mw/Mn=1.78

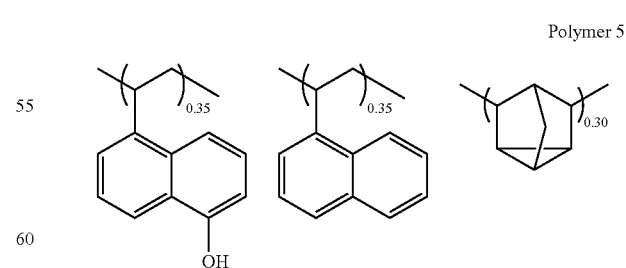

Polymer 5

Synthesis Example 6

A 500-ml flask was charged with 9.4 g of 6-hydroxy-2-vinylnaphthalene, 9.2 g of 9-vinylphenanthrene, and 20 g of toluene as a solvent. In a nitrogen atmosphere, the reactor was cooled to −70° C., followed by vacuum evacuation and nitrogen flow, which were repeated three times. The reactor was warmed up to room temperature, 1.5 g of AIBN as a polymerization initiator was added, and the reactor was heated to 80° C., whereupon reaction occurred for 24 hours. The reaction solution was concentrated to ½, and poured into a mixture of 300 mL methanol and 50 mL water for precipitation. The resulting white solids were filtered and vacuum dried at 60° C., yielding a white polymer, designated Polymer 6.

The polymer was analyzed by $^1$H-NMR and GPC, with the results being shown below.
Copolymer compositional ratio (molar ratio) 6-hydroxy-2-vinylnaphthalene:9-vinylphenanthrene=0.55:0.45
Mw=8,300
Mw/Mn=1.78

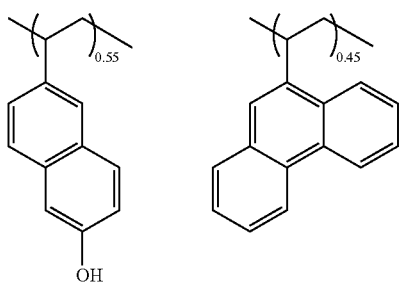

Polymer 6

Synthesis Example 7

A 500-ml flask was charged with 12.0 g of 6-hydroxy-2-vinylnaphthalene, 11.3 g of 1-vinylpyrene, and 20 g of toluene as a solvent. In a nitrogen atmosphere, the reactor was cooled to −70° C., followed by vacuum evacuation and nitrogen flow, which were repeated three times. The reactor was warmed up to room temperature, 1.5 g of AIBN as a polymerization initiator was added, and the reactor was heated to 80° C., whereupon reaction occurred for 24 hours. The reaction solution was concentrated to ½, and poured into a mixture of 300 mL methanol and 50 mL water for precipitation. The resulting white solids were filtered and vacuum dried at 60° C., yielding a white polymer, designated Polymer 7.

The polymer was analyzed by $^1$H-NMR and GPC, with the results being shown below.
Copolymer compositional ratio (molar ratio) 6-hydroxy-2-vinylnaphthalene:1-vinylpyrene=0.68:0.32
Mw=7,200
Mw/Mn=1.68

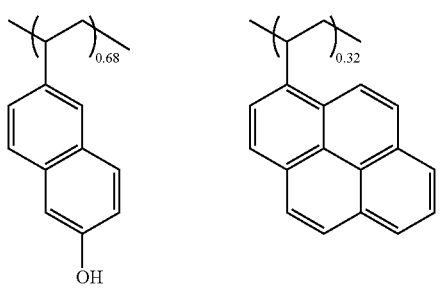

Polymer 7

Synthesis Example 8

A 200-ml flask was charged with 8.5 g of 6-hydroxy-2-vinylnaphthalene, 8.9 g of vinyl ether monomer 1 shown below, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer 8.

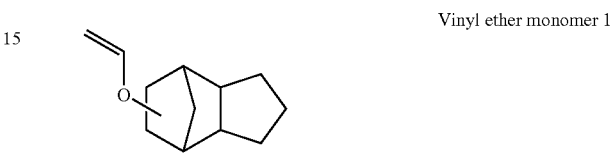

Vinyl ether monomer 1

The polymer was analyzed by $^1$H-NMR and GPC, with the results being shown below.
Copolymer compositional ratio (molar ratio) 6-hydroxy-2-vinylnaphthalene:vinyl ether monomer 1=0.50:0.50
Mw=9,100
Mw/Mn=1.63

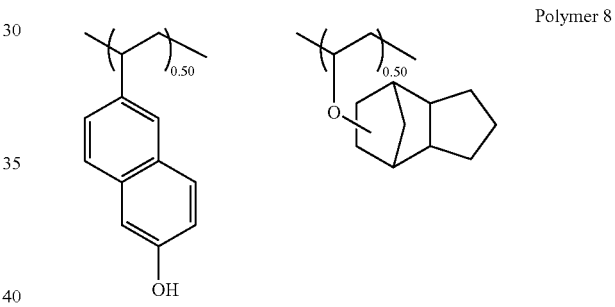

Polymer 8

Synthesis Example 9

A 200-ml flask was charged with 8.5 g of 6-hydroxy-2-vinylnaphthalene, 9.8 g of vinyl ether monomer 2 shown below, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer 9.

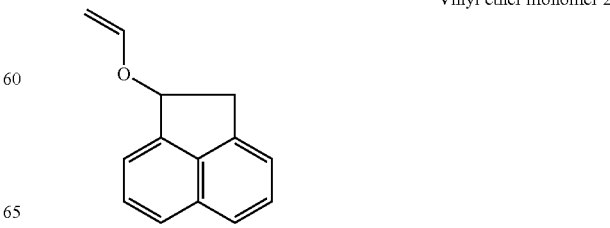

Vinyl ether monomer 2

The polymer was analyzed by $^1$H-NMR and GPC, with the results being shown below.

Copolymer compositional ratio (molar ratio) 6-hydroxy-2-vinylnaphthalene:vinyl ether monomer 2=0.50:0.50
Mw=6,100
Mw/Mn=1.44

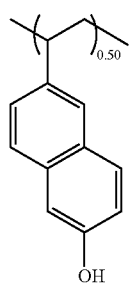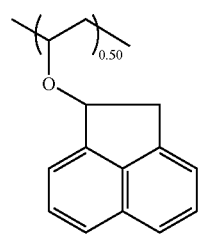

Polymer 9

Synthesis Example 10

A 200-ml flask was charged with 8.5 g of 6-hydroxy-2-vinylnaphthalene, 12.2 g of vinyl ether monomer 3 shown below, and 20 g of 1,2-dichloroethane as a solvent. In a nitrogen atmosphere, 0.5 g of boron trifluoride as a polymerization initiator was added to the reactor, which was heated to 600C, whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer 10.

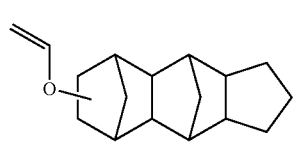

Vinyl ether monomer 3

The polymer was analyzed by $^1$H-NMR and GPC, with the results being shown below.

Copolymer compositional ratio (molar ratio) 6-hydroxy-2-vinylnaphthalene:vinyl ether monomer 3=0.50:0.50
Mw=9,600
Mw/Mn=1.66

Polymer 10

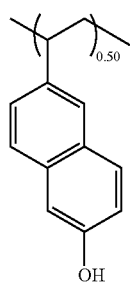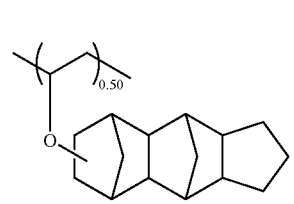

Synthesis Example 11

A 200-ml flask was charged with 8.5 g of 6-hydroxy-2-vinylnaphthalene, 8.9 g of 1-adamantyl vinyl ether, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer 11.

The polymer was analyzed by $^1$H-NMR and GPC, with the results being shown below.

Copolymer compositional ratio (molar ratio) 6-hydroxy-2-vinylnaphthalene:1-adamantyl vinyl ether=0.50:0.50
Mw=8,600
Mw/Mn=1.78

Polymer 11

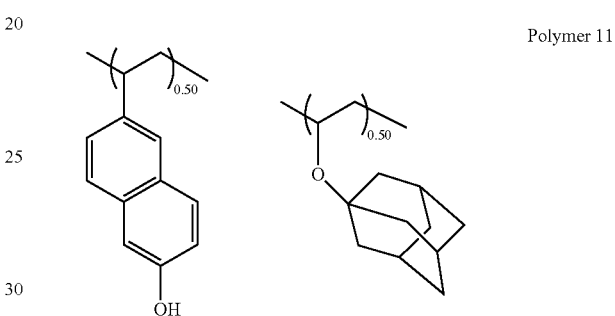

Synthesis Example 12

A 200-ml flask was charged with 5.1 g of 6-hydroxy-2-vinylnaphthalene, 8.9 g of vinyl ether monomer 1 shown above, 3.2 g of acenaphthylene, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer 12.

The polymer was analyzed by $^1$H-NMR and GPC, with the results being shown below.

Copolymer compositional ratio (molar ratio) 6-hydroxy-2-vinylnaphthalene:vinyl ether monomer 1:acenaphthylene=0.30:0.50:0.20
Mw=6,900
Mw/Mn=1.82

Polymer 12

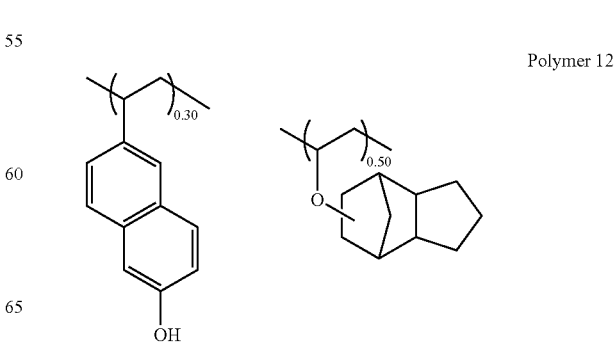

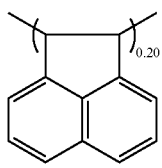

Synthesis Example 13

A 200-ml flask was charged with 5.1 g of 6-hydroxy-2-vinylnaphthalene, 2.2 g of a vinyl ether monomer 4 shown below, 9.9 g of acenaphthylene, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer 13.

Vinyl ether monomer 4

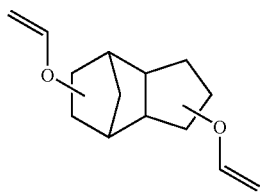

The polymer was analyzed by $^1$H-NMR and GPC, with the results being shown below.
Copolymer compositional ratio (molar ratio) 6-hydroxy-2-vinylnaphthalene:vinyl ether monomer 4:acenaphthylene=0.30:0.10:0.60
Mw=17,900
Mw/Mn=2.33

Polymer 13

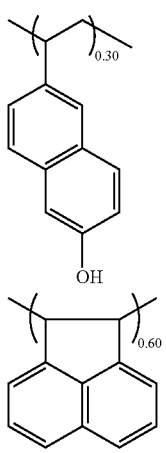

Synthesis Example 14

A 200-ml flask was charged with 5.1 g of 6-hydroxy-2-vinylnaphthalene, 10.3 g of acrylic monomer 1 shown below, 3.2 g of acenaphthylene, and 20 g of 1,2-dichloroethane as a solvent. In a nitrogen atmosphere, 0.5 g of boron trifluoride as a polymerization initiator was added to the reactor, which was heated to 60° C., whereupon reaction occurred for 15 hours. The reaction solution was concentrated to ½, and poured into a mixture of 2.5 L methanol and 0.2 L water for precipitation. The resulting white solids were filtered and vacuum dried at 60° C., yielding a white polymer, designated Polymer 14.

Acrylic monomer 1

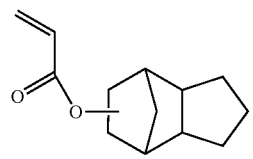

The polymer was analyzed by $^1$H-NMR and GPC, with the results being shown below.
Copolymer compositional ratio (molar ratio) 6-hydroxy-2-vinylnaphthalene:acrylic monomer 1:acenaphthylene=0.30:0.50:0.20
Mw=8,200
Mw/Mn=1.66

Polymer 14

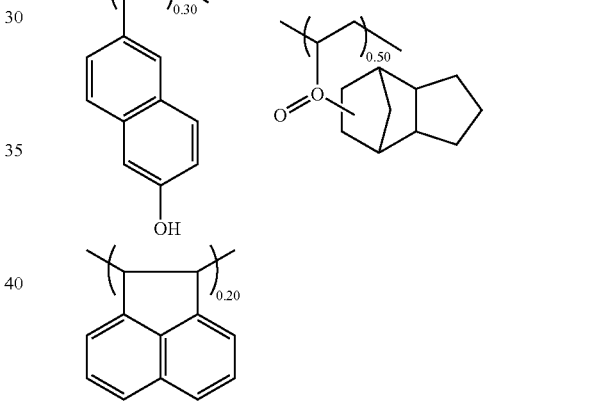

Comparative Synthesis Example 1

A 500-ml flask was charged with 40 g of 4-hydroxystyrene, 160 g of 2-methacrylic acid-1-adamantane, and 40 g of toluene as a solvent. In a nitrogen atmosphere, the reactor was cooled to −70° C., followed by vacuum evacuation and nitrogen flow, which were repeated three times. The reactor was warmed up to room temperature, 4.1 g of AIBN as a polymerization initiator was added, and the reactor was heated to 80° C., whereupon reaction occurred for 24 hours. The reaction solution was concentrated to ½, and poured into a mixture of 300 mL methanol and 50 mL water for precipitation. The resulting white solids were filtered and vacuum dried at 60° C., yielding 188 g of a white polymer, designated Comparative Polymer 1.

The polymer was analyzed by $^1$H-NMR and GPC, with the results being shown below.
Copolymer compositional ratio (molar ratio) 4-hydroxystyrene:2-mechacrylic acid-1-adamantane=0.32:0.68
Mw=10,900
Mw/Mn=1.77

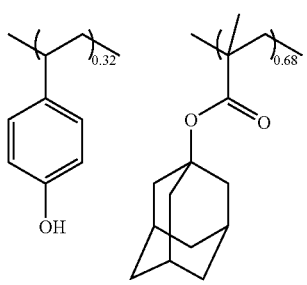

Comparative Polymer 1

Comparative Synthesis Example 2

A 500-ml flask was charged with 45 g of 5-hydroxy-1-vinylnaphthalene and 40 g of toluene as a solvent. In a nitrogen atmosphere, the reactor was cooled to -70° C., followed by vacuum evacuation and nitrogen flow, which were repeated three times. The reactor was warmed up to room temperature, 4.1 g of AIBN as a polymerization initiator was added, and the reactor was heated to 80° C., whereupon reaction occurred for 24 hours. The reaction solution was concentrated to ½, and poured into a mixture of 300 mL methanol and 50 mL water for precipitation. The resulting white solids were filtered and vacuum dried at 60° C., yielding a white polymer, designated Comparative Polymer 2.

The polymer was analyzed by $^1$H-NMR and GPC, with the results being shown below.

Copolymer compositional ratio (molar ratio) 5-hydroxy-1-vinylnaphthalene=1.0
Mw=10,500
Mw/Mn=1.66

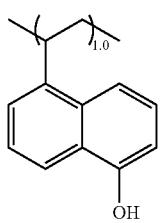

Comparative Polymer 2

Comparative Synthesis Example 3

A 500-ml flask was charged with 20 g of 5-hydroxy-1-vinylnaphthalene, 15 g of 1-vinylnaphthalene, and 40 g of toluene as a solvent. In a nitrogen atmosphere, the reactor was cooled to –70° C., followed by vacuum evacuation and nitrogen flow, which were repeated three times. The reactor was warmed up to room temperature, 4.1 g of AIBN as a polymerization initiator was added, and the reactor was heated to 80° C., whereupon reaction occurred for 24 hours. The reaction solution was concentrated to ½, and poured into a mixture of 300 mL methanol and 50 mL water for precipitation. The resulting white solids were filtered and vacuum dried at 60° C., yielding a white polymer, designated Comparative Polymer 3.

The polymer was analyzed by $^1$H-NMR and GPC, with the results being shown below.

Copolymer compositional ratio (molar ratio) 5-hydroxy-1-vinylnaphthalene:1-vinylnaphthalene=0.6:0.4
Mw=11,000
Mw/Mn=1.74

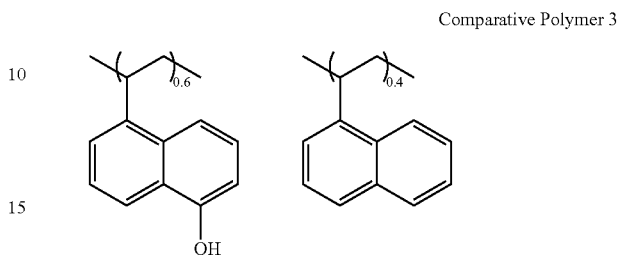

Comparative Polymer 3

Examples and Comparative Examples

Preparation of Resist Undercoat-forming Material

Resist undercoat layer-coating solutions (Examples 1-20, Comparative Examples 1-3) were prepared by dissolving a resin component (Polymers 1-14, Comparative Polymers 1-3, oligomer blend 1, or low-nuclear phenol blends 1-3), an acid generator (AG1, 2), and a crosslinker (CR1, 2) in a solvent containing 0.1 wt % of Fluorad FC-430 (3M-Sumitomo Co., Ltd.) according to the formulation shown in Table 1, and passing through a fluoroplastic filter having a pore size of 0.1 µm.

Polymers 1-14:
Polymers obtained in Synthesis Examples 1 to 14

Comparative Polymers 1-3:
Polymers obtained in Comparative Synthesis Examples 1 to 3

Oligomer Blend 1:

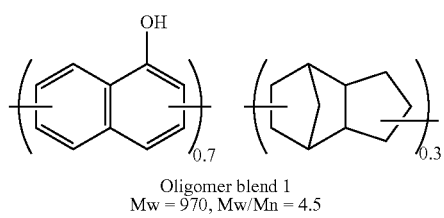

Oligomer blend 1
Mw = 970, Mw/Mn = 4.5

Low-nuclear Phenol Blends 1-3:

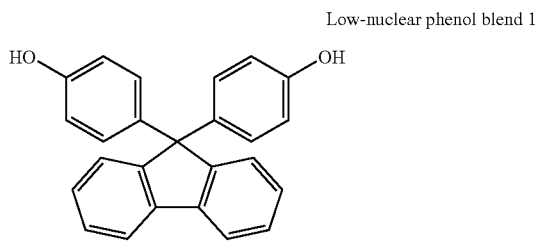

Low-nuclear phenol blend 1

-continued

Low-nuclear phenol blend 2

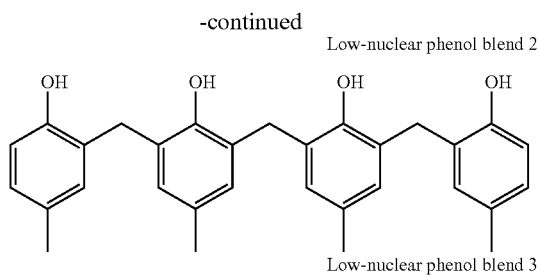

Low-nuclear phenol blend 3

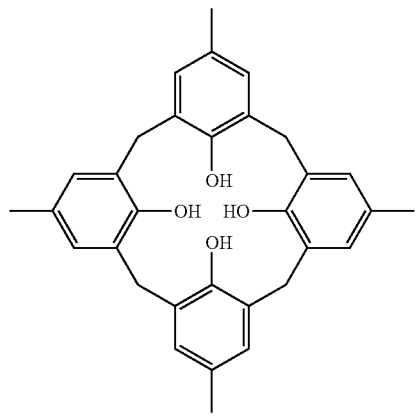

Acid Generator:

AG1

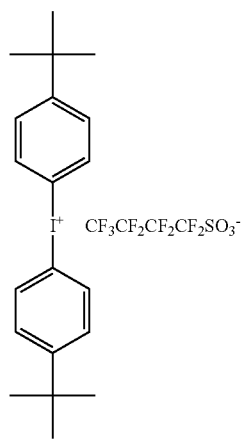

-continued

AG2

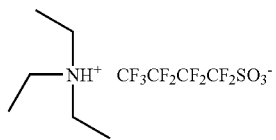

Crosslinker:

CR1

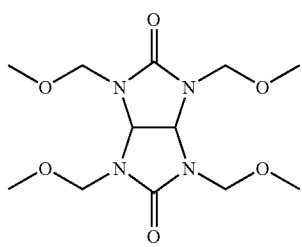

CR2

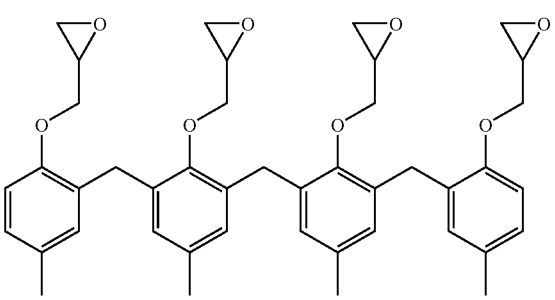

Organic Solvent:

PGMEA: propylene glycol monomethyl ether acetate

PGME: propylene glycol monomethyl ether

Each of the undercoat-forming material solutions was applied onto a silicon substrate and baked at 200° C. for 60 seconds to form a resist undercoat layer of 500 nm thick. Using a variable angle spectroscopic ellipsometer (VASE®) of J. A. Woollam Co., the refractive index (n, k) at wavelength 193 nm of the resist undercoat layers was determined. The results are shown in Table 1.

TABLE 1

|  | Polymer (pbw) | Crosslinker (pbw) | Acid generator (pbw) | Solvent (pbw) | Refractive index @193 nm | |
| --- | --- | --- | --- | --- | --- | --- |
|  |  |  |  |  | n | k |
| Example 1 | Polymer 1 (28.0) | CR1(4) | AG1(1) | PGMEA(100) | 1.40 | 0.25 |
| Example 2 | Polymer 2 (28.0) | CR1(4) | AG1(1) | PGMEA(100) | 1.41 | 0.26 |
| Example 3 | Polymer 3 (28.0) | CR1(4) | AG1(1) | PGMEA(100) | 1.45 | 0.40 |
| Example 4 | Polymer 4 (28.0) | CR1(4) | AG1(1) | PGMEA(100) | 1.50 | 0.19 |
| Example 5 | Polymer 5 (28.0) | CR1(4) | AG1(1) | PGMEA(100) | 1.48 | 0.20 |
| Example 6 | Polymer 6 (28.0) | CR1(4) | AG1(1) | PGMEA(100) | 1.42 | 0.24 |
| Example 7 | Polymer 7 (28.0) | CR1(4) | AG1(1) | PGMEA(100) | 1.41 | 0.28 |
| Example 8 | Polymer 1 (15.0) + Oligomer blend 1 (15.0) | CR1(4) | AG1(1) | PGMEA(100) | 1.45 | 0.20 |

TABLE 1-continued

| | Polymer | Crosslinker | Acid generator | Solvent | Refractive index @193 nm | |
|---|---|---|---|---|---|---|
| | (pbw) | (pbw) | (pbw) | (pbw) | n | k |
| Example 9 | Polymer 3 (20.0) + Low-nuclear phenol blend 1 (10.0) | CR1(4) | AG1(1) | PGMEA(100) | 1.43 | 0.30 |
| Example 10 | Polymer 3 (20.0) + Low-nuclear phenol blend 2 (10.0) | CR1(4) | AG1(1) | PGMEA(100) | 1.44 | 0.45 |
| Example 11 | Polymer 3 (20.0) + Low-nuclear phenol blend 3 (10.0) | CR1(4) | AG1(1) | PGMEA(100) | 1.46 | 0.44 |
| Example 12 | Polymer 3 (28.0) | CR2(4) | AG1(1) | PGMEA(100) | 1.40 | 0.42 |
| Example 13 | Polymer 3 (28.0) | CR1(4) | AG2(1) | PGMEA(70) PGME(30) | 1.42 | 0.39 |
| Example 14 | Polymer 8 (20.0) + Low-nuclear phenol blend 1 (10.0) | CR1(4) | AG1(1) | PGMEA(100) | 1.52 | 0.30 |
| Example 15 | Polymer 9 (20.0) | CR1(4) | AG1(1) | PGMEA(100) | 1.39 | 0.21 |
| Example 16 | Polymer 10 (20.0) + Low-nuclear phenol blend 1 (10.0) | CR1(4) | AG1(1) | PGMEA(100) | 1.56 | 0.25 |
| Example 17 | Polymer 11 (20.0) + Low-nuclear phenol blend 1 (10.0) | CR1(4) | AG1(1) | PGMEA(100) | 1.52 | 0.30 |
| Example 18 | Polymer 12 (20.0) + Low-nuclear phenol blend 1 (10.0) | CR1(4) | AG1(1) | PGMEA(100) | 1.49 | 0.28 |
| Example 19 | Polymer 12 (17.0) | CR1(4) | AG1(1) | PGMEA(100) | 1.40 | 0.20 |
| Example 20 | Polymer 14 (17.0) | CR1(4) | AG1(1) | PGMEA(100) | 1.45 | 0.18 |
| Comparative Example 1 | Comparative Polymer 1 (22.0) | CR1(4) | AG1(1) | PGMEA(100) | 1.70 | 0.22 |
| Comparative Example 2 | Comparative Polymer 2 (22.0) | CR1(4) | AG1(1) | PGMEA(100) | 1.24 | 0.22 |
| Comparative Example 3 | Comparative Polymer 3 (22.0) | CR1(4) | AG1(1) | PGMEA(100) | 1.22 | 0.21 |

As seen from Table 1, the resist undercoat layers of Examples 1 to 20 have a refractive index including a value of n from 1.4 to 1.5 and a value of k from 0.19 to 0.45, indicating a refractive index (n) and an extinction coefficient (k) appropriate to provide a satisfactory antireflective effect at a film thickness of at least 200 nm.

Then, dry etching tests were conducted. There were prepared undercoat layers (Examples 1-20, Comparative Examples 1-3) as used for the measurement of refractive index. These undercoat layers were examined by a test (1) of etching with $CF_4/CHF_3$ gas using a dry etching instrument TE-8500P by Tokyo Electron, Ltd. A difference in thickness of the undercoat layer or resist before and after the etching test was determined, from which an etching rate was computed. The results are shown in Table 2.

| (1) $CF_4/CHF_3$ gas etching test | |
|---|---|
| Chamber pressure | 40.0 Pa |
| RF power | 1000 W |
| Gap | 9 mm |
| $CHF_3$ gas flow rate | 30 ml/min |
| $CF_4$ gas flow rate | 30 ml/min |
| Ar gas flow rate | 100 ml/min |
| Time | 60 sec |

TABLE 2

| Undercoat layer | $CF_4/CHF_3$ gas etching rate (nm/min) |
|---|---|
| Example 1 | 75 |
| Example 2 | 74 |
| Example 3 | 79 |
| Example 4 | 72 |
| Example 5 | 71 |
| Example 6 | 75 |
| Example 7 | 67 |
| Example 8 | 81 |
| Example 9 | 83 |
| Example 10 | 82 |
| Example 11 | 80 |
| Example 12 | 74 |
| Example 13 | 76 |
| Example 14 | 88 |
| Example 15 | 81 |
| Example 16 | 80 |
| Example 17 | 85 |
| Example 18 | 82 |
| Example 19 | 80 |
| Example 20 | 89 |
| Comparative Example 1 | 144 |
| Comparative Example 2 | 110 |
| Comparative Example 3 | 93 |

The undercoat layers (Examples 1-20, Comparative Examples 1-3) were further examined by a test (2) of etching with $Cl_2/BCl_3$ gas using a dry etching instrument L-507D-L by Anelva Corp. A difference in thickness of the polymer layer before and after the etching test was determined, from which an etching rate was computed. The results are shown in Table 3.

| (2) $Cl_2/BCl_3$ gas etching test | |
|---|---|
| Chamber pressure | 40.0 Pa |
| RF power | 300 W |
| Gap | 9 mm |
| $Cl_2$ gas flow rate | 30 ml/min |

TABLE 3-continued

| | (2) Cl$_2$/BCl$_3$ gas etching test |
|---|---|
| BCl$_3$ gas flow rate | 30 ml/min |
| CHF$_3$ gas flow rate | 100 ml/min |
| O$_2$ gas flow rate | 2 ml/min |
| Time | 60 sec |

TABLE 3

| Undercoat layer | Cl$_2$/BCl$_3$ gas etching rate (nm/min) |
|---|---|
| Example 1 | 80 |
| Example 2 | 79 |
| Example 3 | 82 |
| Example 4 | 88 |
| Example 5 | 80 |
| Example 6 | 85 |
| Example 7 | 75 |
| Example 8 | 83 |
| Example 9 | 89 |
| Example 10 | 87 |
| Example 11 | 86 |
| Example 12 | 79 |
| Example 13 | 78 |
| Example 14 | 92 |
| Example 15 | 86 |
| Example 16 | 85 |
| Example 17 | 88 |
| Example 18 | 85 |
| Example 19 | 82 |
| Example 20 | 92 |
| Comparative Example 1 | 166 |
| Comparative Example 2 | 100 |
| Comparative Example 3 | 98 |

Preparation of Resist Topcoat-forming Material

An ArF single-layer resist composition solution was prepared by dissolving an ArF single-layer resist composition (SL resist for ArF) in an organic solvent containing 0.1 wt % of Fluorad FC-430 (3M-Sumitomo Co., Ltd.) according to the formulation shown in Table 4, and passing through a fluoroplastic filter having a pore size of 0.1 μm.

TABLE 4

| No. | SL resist for ArF |
|---|---|
| Polymer (pbw) | ArF SL resist polymer 1 (100) |
| Acid generator (pbw) | PAG1 (4.4) |
| Basic compound (pbw) | Amine (0.5) |
| Solvent (pbw) | PGMEA (1500) |

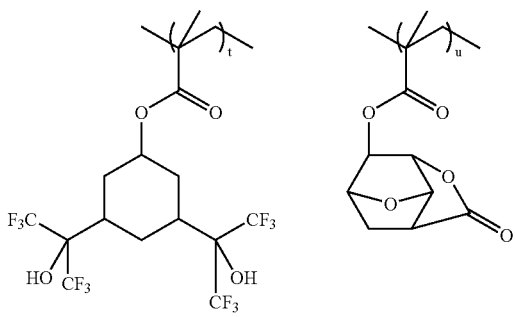

TABLE 4-continued

| No. | SL resist for ArF |
|---|---|

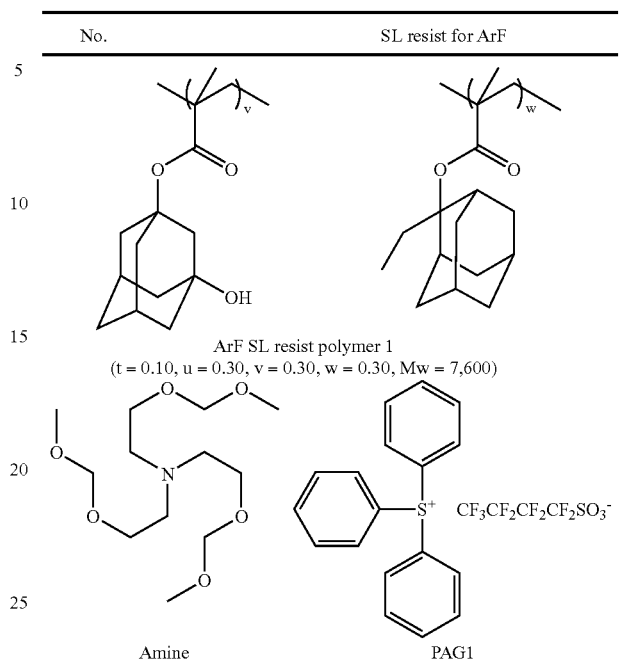

ArF SL resist polymer 1
(t = 0.10, u = 0.30, v = 0.30, w = 0.30, Mw = 7,600)

Amine          PAG1

An ArF silicon-containing intermediate layer coating solution was prepared by dissolving an ArF Si-containing intermediate layer composition in an organic solvent containing 0.1 wt % of Fluorad FC-430 (3M-Sumitomo Co., Ltd.) according to the formulation shown in Table 5, and passing through a fluoroplastic filter having a pore size of 0.1 μm.

TABLE 5

| | Si-containing intermediate layer material (SOG) for ArF |
|---|---|
| Polymer (pbw) | ArF Si-containing intermediate layer polymer 1 (100) |
| Acid generator (pbw) | AG1 (2.0) |
| Crosslinker | — |
| Solvent (pbw) | PGMEA (2500) |

ArF Si-containing intermediate layer polymer 1
(o = 0.20, p = 0.80, Mw = 3,300)

The undercoat-forming material solution (Examples 1-20, Comparative Examples 1-3) was coated onto a SiO$_2$ substrate of 300 nm thick and baked at 200° C. for 60 seconds to form an undercoat of 300 nm thick. The silicon-containing intermediate layer-forming material solution (SOG) was coated on the undercoat and baked at 200° C. for 60 seconds to form an intermediate layer of 90 nm thick. The ArF single-layer resist material solution was then coated thereon and baked at 110° C. for 60 seconds to form a photoresist layer of 160 nm thick.

Thereafter, the resist layer was exposed using an ArF laser stepper S307E (Nikon Corporation, NA 0.85, σ 0.93, 2/3 annular illumination, Cr mask), then baked (PEB) at 110° C. for 60 seconds, and developed for 60 seconds with a 2.38 wt % aqueous solution of tetramethylammonium hydroxide (TMAH), thereby giving a positive pattern. The profile of the 80 nm line-and-space pattern was observed. The results are shown in Table 6.

The resist pattern resulting from ArF exposure and development was transferred to the SOG film by fluorine gas etching. A set of etching conditions (3) is shown below.

| (3) $CF_4/CHF_3$ gas etching | |
|---|---|
| Chamber pressure | 40.0 Pa |
| RF power | 1000 W |
| Gap | 9 mm |
| $CHF_3$ gas flow rate | 20 ml/min |
| $CF_4$ gas flow rate | 60 ml/min |
| Ar gas flow rate | 200 ml/min |
| Time | 30 sec |

Next, the pattern transferred to the SOG film was transferred to the undercoat layer by oxygen gas etching. A set of etching conditions (4) is shown below.

| (4) Oxygen gas etching | |
|---|---|
| Chamber pressure | 450 mTorr |
| RF power | 600 W |
| Gap | 9 mm |
| $N_2$ gas flow rate | 60 sccm |
| $O_2$ gas flow rate | 10 sccm |
| Time | 20 sec |

Finally, the $SiO_2$ substrate was processed by etching under the above-described conditions (1) while using the undercoat layer pattern as a mask.

A cross section of the pattern was observed under an electron microscope S-4700 (Hitachi, Ltd.). The pattern profile was compared in this way, with the results shown in Table 6.

TABLE 6

| | Topcoat resist | Pattern profile after development | SOG profile after transfer etching | Undercoat profile after transfer etching | Substrate profile after transfer etching |
|---|---|---|---|---|---|
| Example 1 | SL resist for ArF | perpendicular | perpendicular | perpendicular | perpendicular |
| Example 2 | SL resist for ArF | perpendicular | perpendicular | perpendicular | perpendicular |
| Example 3 | SL resist for ArF | perpendicular | perpendicular | perpendicular | perpendicular |
| Example 4 | SL resist for ArF | perpendicular | perpendicular | perpendicular | perpendicular |
| Example 5 | SL resist for ArF | perpendicular | perpendicular | perpendicular | perpendicular |
| Example 6 | SL resist for ArF | perpendicular | perpendicular | perpendicular | perpendicular |
| Example 7 | SL resist for ArF | perpendicular | perpendicular | perpendicular | perpendicular |
| Example 8 | SL resist for ArF | perpendicular | perpendicular | perpendicular | perpendicular |
| Example 9 | SL resist for ArF | perpendicular | perpendicular | perpendicular | perpendicular |
| Example 10 | SL resist for ArF | perpendicular | perpendicular | perpendicular | perpendicular |
| Example 11 | SL resist for ArF | perpendicular | perpendicular | perpendicular | perpendicular |
| Example 12 | SL resist for ArF | perpendicular | perpendicular | perpendicular | perpendicular |
| Example 13 | SL resist for ArF | perpendicular | perpendicular | perpendicular | perpendicular |
| Example 14 | SL resist for ArF | perpendicular | perpendicular | perpendicular | perpendicular |
| Example 15 | SL resist for ArF | perpendicular | perpendicular | perpendicular | perpendicular |
| Example 16 | SL resist for ArF | perpendicular | perpendicular | perpendicular | perpendicular |
| Example 17 | SL resist for ArF | perpendicular | perpendicular | perpendicular | perpendicular |
| Example 18 | SL resist for ArF | perpendicular | perpendicular | perpendicular | perpendicular |
| Example 19 | SL resist for ArF | perpendicular | perpendicular | perpendicular | perpendicular |
| Example 20 | SL resist for ArF | perpendicular | perpendicular | perpendicular | perpendicular |
| Comparative Example 1 | SL resist for ArF | perpendicular | perpendicular | perpendicular | tapered and slimmed |
| Comparative Example 2 | SL resist for ArF | perpendicular | perpendicular | perpendicular | tapered |
| Comparative Example 3 | SL resist for ArF | perpendicular | perpendicular | perpendicular | slightly tapered |

It is seen from Tables 2 and 3 that when etched with $CF_4/CHF_3$ gas and $Cl_2/BCl_3$ gas, the undercoat layers within the scope of the invention exhibit significantly slower etching rates than Comparative Examples 1 to 3. As seen from Table 6, when the undercoat material is applied to the trilayer resist processing, the profile of resist after development, and the profile of undercoat layer after oxygen etching and after substrate processing by etching are satisfactory.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

Japanese Patent Application Nos. 2005-341386 and 2006-120120 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photoresist undercoat-forming material for forming an undercoat among lithographic multilayer resist coatings, comprising a copolymer which comprises recurring units having the general formula (1):

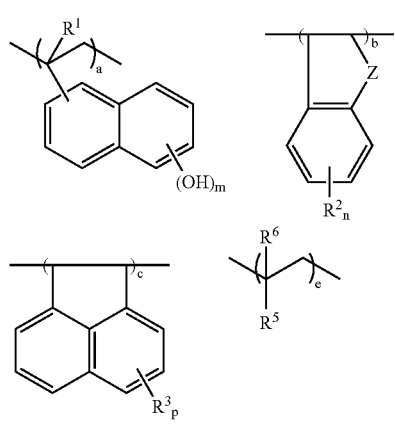

wherein $R^1$ and $R^6$ each are hydrogen or methyl,
$R^2$, $R^3$ and $R^4$ each are a hydrogen atom, $C_1$-$C_4$ alkyl group, alkoxy group, hydroxy group, acetoxy group or alkoxycarbonyl group, or $C_6$-$C_{10}$ aryl group,
$R^5$ is —O—$R^7$, —C(=O)—O—$R^7$, —O—C(=O)—$R^7$, or —C(=O)—$NR^8$—$R^7$, wherein $R^7$ is an organic group, and $R^8$ is a hydrogen atom or $C_1$-$C_6$ hydrocarbon group,
m is 1 or 2, n is an integer of 0 to 4, p is an integer of 0 to 6, a, b, c, and e are numbers in the range: $0<a<1.0$, $0 \leq b \leq 0.8$, $0 \leq c \leq 0.8$, $0 \leq e \leq 0.8$, and $0 \leq b+c+e<1.0$,
and said organic group of $R^7$ has the formula selected from the group consisting of the to following formulae:

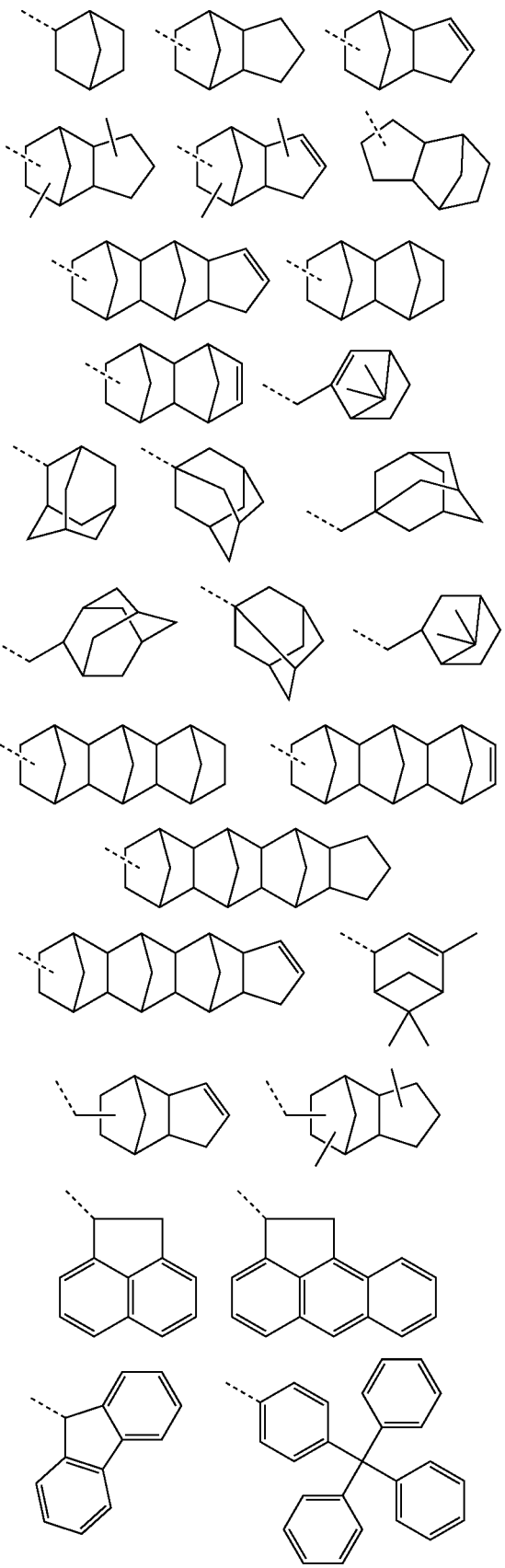

-continued

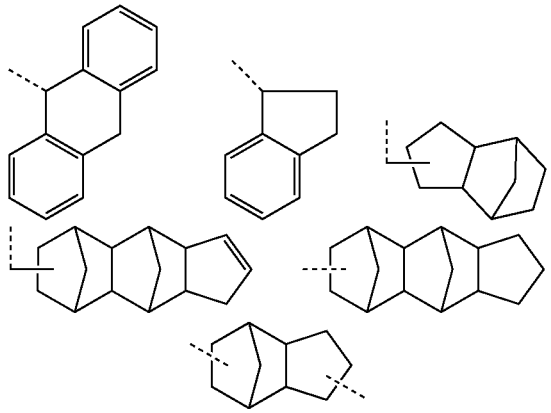

wherein each dotted line in the formulae represents a valence bond.

2. The material of claim 1, further comprising at least one component selected from the group consisting of an organic solvent, acid generator, and crosslinker.

3. A patterning process comprising the steps of:
applying the undercoat-forming material of claim 1 onto a processable substrate to form an undercoat layer,
applying a photoresist compostion onto the undercoat layer to form a photoresist layer,
exposing the photoresist layer in a predetermined region to radiation,
developing the photoresist layer with a developer to form a photoresist pattern, and
processing the undercoat layer and the substrate through the patterned photoresist layer as a mask, by means of a dry etching apparatus.

4. The patterning process of claim 3, wherein said photoresist compostion comprises a silicon atom-bearing polymer, and the processing step includes dry etching the undercoat layer through the photoresist layer as a mask with an oxygen or hydrogen etching gas.

5. A patterning process comprising the steps of:
applying the undercoat-forming material of claim 1 onto a processable substrate to form an undercoat layer,
applying a silicon atom-containing intermediate layer over the undercoat layer,
applying a photoresist composition onto the intermediate layer to form a photoresist layer,
exposing the photoresist layer in a predetermined region to radiation,
developing the photoresist layer with a developer to form a photoresist pattern,
processing the intermediate layer through the patterned photoresist layer as a mask,
removing the patterned photoresist layer, and
processing the undercoat layer and then the substrate through the processed intermediate layer as a mask,
the processing steps using a dry etching apparatus.

6. The patrernine process of claim 5, wherein said photoresist composition comprises a silicon atom-free polymer, and the step of processing the undercoat layer includes dry etching with an oxygen or hydrogen etching gas.

* * * * *